United States Patent
Kokubo et al.

(10) Patent No.: US 6,680,487 B1
(45) Date of Patent: Jan. 20, 2004

(54) SEMICONDUCTOR COMPRISING A TFT PROVIDED ON A SUBSTRATE HAVING AN INSULATING SURFACE AND METHOD OF FABRICATING THE SAME

(75) Inventors: Chiho Kokubo, Kanagawa (JP); Hirokazu Yamagata, Tokyo (JP); Shunpei Yamazaki, Tokyo (JP)

(73) Assignee: Semiconductor Energy Laboratory Co., Ltd., Kanagawa (JP)

( * ) Notice: Subject to any disclaimer, the term of this patent is extended or adjusted under 35 U.S.C. 154(b) by 0 days.

(21) Appl. No.: 09/567,403

(22) Filed: May 8, 2000

(30) Foreign Application Priority Data

May 14, 1999 (JP) .......................................... 11-135062

(51) Int. Cl.$^7$ .............................................. H01L 29/76
(52) U.S. Cl. .............................. 257/66; 257/67; 257/49; 257/51; 257/52; 257/70
(58) Field of Search .............................. 257/66, 67, 49, 257/51, 52, 70

(56) References Cited

U.S. PATENT DOCUMENTS

| 5,594,569 A | 1/1997 | Konuma et al. |
| 5,605,846 A | 2/1997 | Ohtani et al. |
| 5,608,232 A | * 3/1997 | Yamazaki et al. ............. 257/66 |
| 5,619,044 A | 4/1997 | Makita et al. |
| 5,637,515 A | 6/1997 | Takemura |
| 5,643,826 A | 7/1997 | Ohtani et al. |
| 5,696,003 A | 12/1997 | Makita et al. |
| 5,744,824 A | 4/1998 | Kousai et al. |
| 5,814,835 A | * 9/1998 | Makita et al. ................. 257/64 |
| 5,821,562 A | 10/1998 | Makita et al. |
| 5,824,573 A | 10/1998 | Zhang et al. |
| 5,843,225 A | 12/1998 | Takayama et al. |
| 5,915,174 A | 6/1999 | Yamazaki et al. |
| 5,922,125 A | * 7/1999 | Zhang ............................ 117/9 |
| 5,923,962 A | 7/1999 | Ohtani et al. |
| 5,962,871 A | * 10/1999 | Zhang et al. .................. 257/66 |
| 6,160,269 A | * 12/2000 | Takemura et al. ............. 257/59 |
| 6,162,667 A | * 12/2000 | Funai et al. ................. 438/166 |
| 6,285,247 B1 | * 9/2001 | Shoji ........................... 327/544 |

FOREIGN PATENT DOCUMENTS

| EP | 08-006053 | 1/1996 |
| EP | 08-008181 | 1/1996 |
| EP | 08-213317 | 8/1996 |
| JP | 6-232059 | 8/1994 |
| JP | 06244104 | * 9/1994 |
| JP | 7-130652 | 5/1995 |
| JP | 7-321339 | 12/1995 |
| JP | 9-162416 | 6/1997 |
| JP | 10-247735 | 9/1998 |
| JP | 11-97702 | 4/1999 |
| JP | 11-133463 | 5/1999 |

OTHER PUBLICATIONS

Ohtani et al., "LP–B: Late–News Poster: A 60–in. HDTV Rear–Projector with Continuous–Grain Silicon Technology", May 17–22, 1998, pp. 467–470, SID 98 Digest, International Symposium Digest of Technical Papers, vol. XXIX.

(List continued on next page.)

Primary Examiner—Eddie Lee
Assistant Examiner—Eugene Lee
(74) Attorney, Agent, or Firm—Eric J. Robinson; Robinson Intellectual Property Law Office, P.C.

(57) ABSTRACT

There is disclosed a semiconductor device and a method of fabricating the semiconductor device in which a heat time required for crystal growth is shortened and a process is simplified. Two catalytic element introduction regions are arranged at both sides of one active layer and crystallization is made. A boundary portion where crystal growth from one catalytic element introduction region meets crystal growth from the other catalytic element introduction region is formed in a region which becomes a source region or drain region.

35 Claims, 28 Drawing Sheets

(1 of 28 Drawing Sheet(s) Filed in Color)

OTHER PUBLICATIONS

H. Furue et al., "Characteristics and Driving Scheme of Polymer–Stabilized Monostable FLCD Exhibiting Fast Response Time and High Contrast Ratio with Gray–Scale Capability", SID 98 Digest, pp. 782–785.

T. Yoshida et al., "A Full–Color Thresholdless Antiferroelectric LCD Exhibiting Wide Viewing Angle with Fast Response Time", SID 97 Digest, pp. 841–844.

S. Inui et al., "Thresholdless antiferroelectricity in liquid crystals and its application to displays", 1996, J. Mater. Chem., 1996, 6(4), pp. 671–673.

R. Shimokawa et al., "Characterization of High–Efficiency Cast–Si Solar Cell Wafers by MBIC Measurement", Japanese Journal of Applied Physics, 1988, vol. 27, No. 5, pp. 751–758.

* cited by examiner

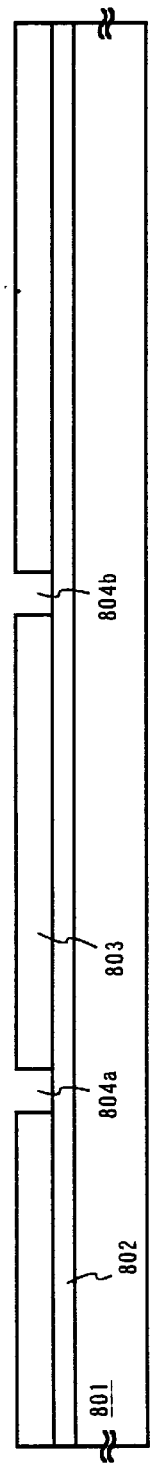
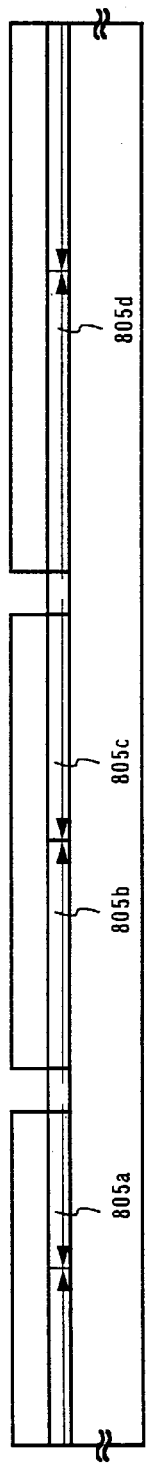
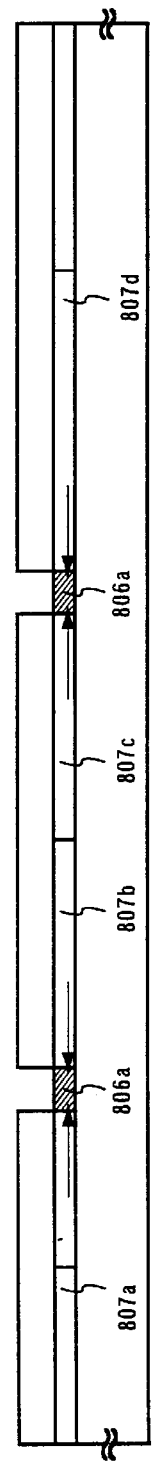
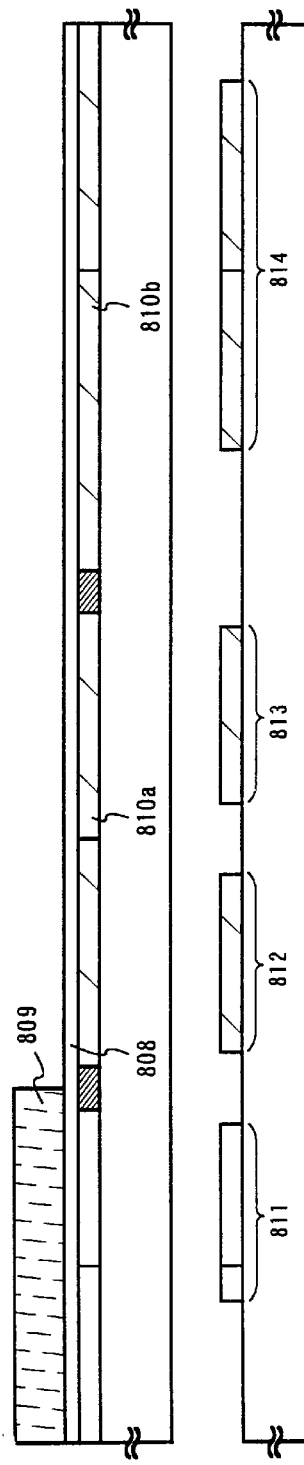
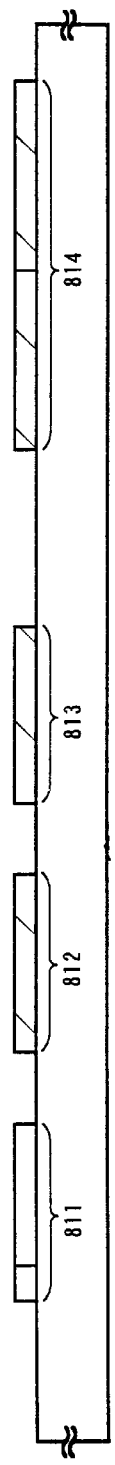

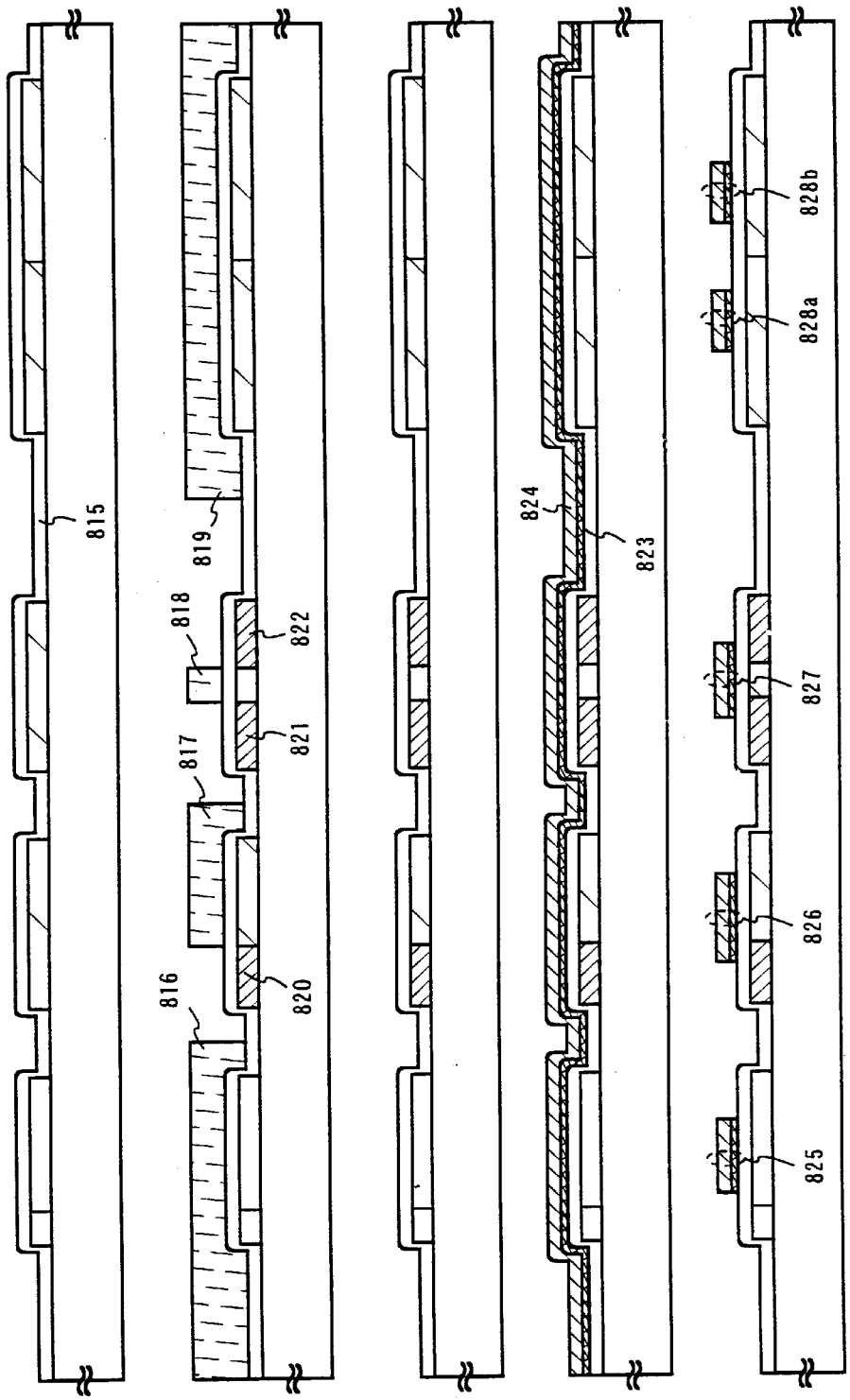

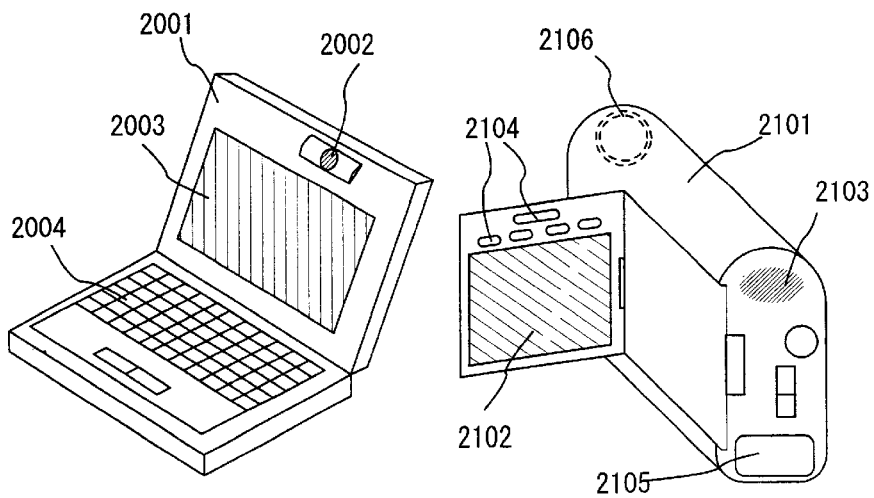
FIG. 18A
FIG. 18B
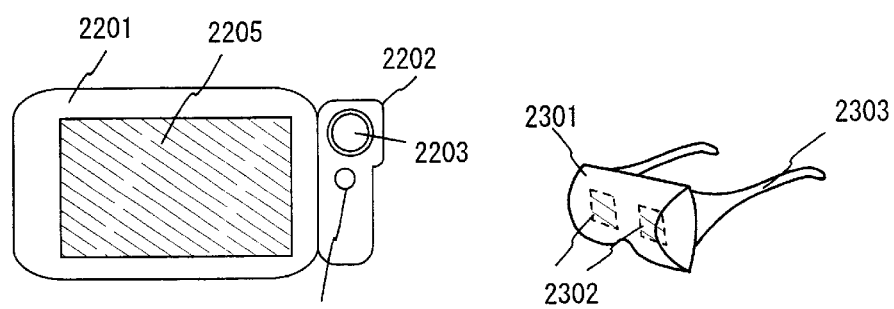
FIG. 18C
FIG. 18D
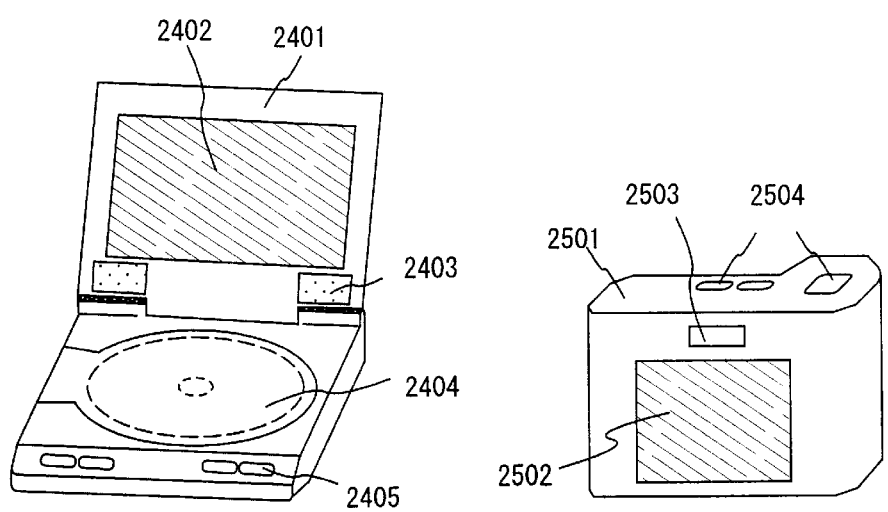
FIG. 18E
FIG. 18F

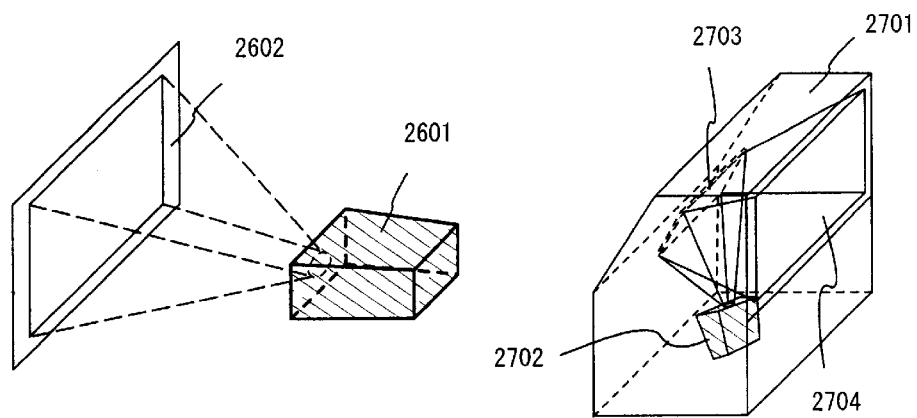
FIG. 19A
FIG. 19B
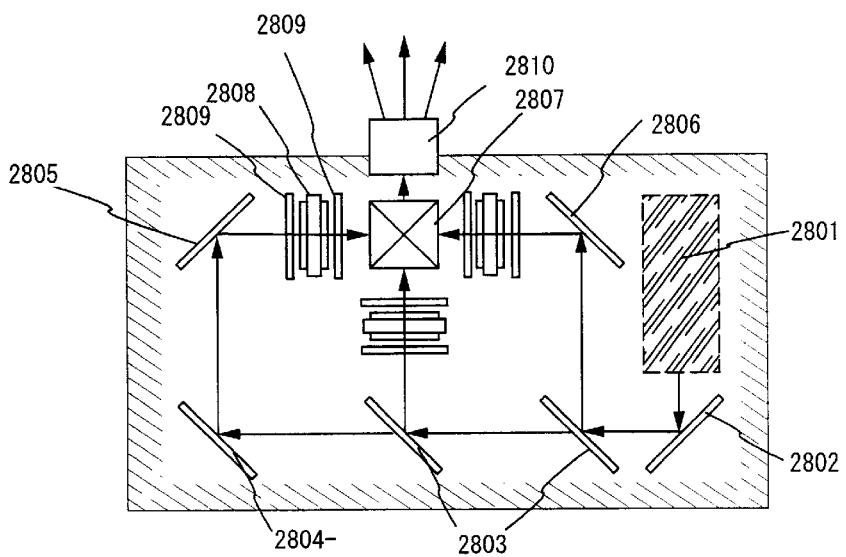
FIG. 19C
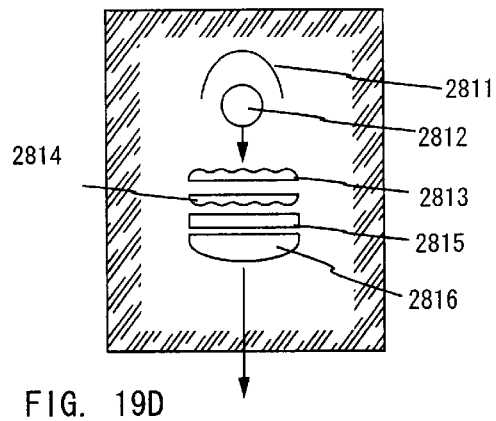
FIG. 19D

SEMICONDUCTOR COMPRISING A TFT PROVIDED ON A SUBSTRATE HAVING AN INSULATING SURFACE AND METHOD OF FABRICATING THE SAME

BACKGROUND OF THE INVENTION

1. Field of the Invention

The present invention relates to a semiconductor device including a circuit constituted by thin film transistors (hereinafter referred to as TFTs) and a method of fabricating the same. For example, the invention relates to an electro-optical device typified by a liquid crystal display panel, and an electronic apparatus incorporating such an electro-optical device as a component.

Note that in the present specification, the term "semiconductor device" indicates any devices capable of functioning by using semiconductor characteristics, and all of the electro-optical devices, semiconductor circuits, and electronic apparatuses are semiconductor devices.

2. Description of the Related Art

In recent years, attention has been paid to a technique to construct a thin film transistor (TFT) by using a semiconductor thin film (thickness of several to several hundreds nm) formed over a substrate having an insulating surface. The thin film transistor is widely used for an electronic device such as an IC or electro-optical device, and its development is hastened especially as a switching element of an image display device.

As a semiconductor thin film forming an active layer of a TFT, although a noncrystalline silicon film (typically an amorphous silicon film) has been often used. a demand for a TFT having a faster operation speed is increased, and a crystalline silicon film (typically a polysilicon film) has become the mainstream. As a technique for obtaining the crystalline silicon film, a method in which after an amorphous silicon film is formed, the film is crystallized by a heat treatment or irradiation of laser light, is often used.

Besides, there is disclosed a technique (Japanese Patent Unexamined Publication No. Hei. 6-232059 and No. Hei. 7-321339) in which after an amorphous silicon film is formed, a catalytic element (for example, nickel) for promoting crystallization of the amorphous silicon film is introduced, and a heat treatment is carried out to obtain a crystalline silicon film. According to this technique, it is possible to obtain a uniform crystalline silicon film in a short time.

However, the catalytic element for promoting crystallization of the amorphous silicon film often deteriorates the characteristics of the TFT. Then after crystallization, a region where the catalytic element exists at a high concentration is removed by etching or the like.

Hereinafter, a specific description will be made on a crystallizing technique using a catalytic element for promoting crystallization of an amorphous silicon film, and a technique for removing a region where the catalytic element exists at a high concentration.

In FIGS. 1A and 1B, reference numeral 101 designates a silicon film; 102, a beltlike region on a silicon film surface (hereinafter referred to as a catalytic element introduction region); and 103, a silicon oxide mask covering the silicon film surface other than the catalytic element introduction region. Note that by using the silicon oxide mask 103, the catalytic element is selectively introduced into the catalytic element introduction region 102.

First, the catalytic element is introduced into the catalytic element introduction region 102, and by carrying out a heat treatment, crystals are made to grow from the catalytic element introduction region 102 in a direction parallel to an insulating surface and a direction almost vertical to a long side of the catalytic element introduction region 102. Note that reference numeral 104 designates the direction of crystal growth.

A leading end portion of crystal growth obtained in this way is designated by 105. It is known that the catalytic element of high concentration exists in the leading end portion 105 of the crystal growth. When a crystal growth distance exceeds some value, a region where an active layer of a TFT can be disposed is formed between the beltlike catalytic element introduction region 102 and the leading end portion 105 of the crystal growth where the catalytic element exists at a high concentration.

Next, when the active layer of the TFT is formed using the region sandwiched between the leading end portion 105 of the crystal growth and the beltlike catalytic element introduction region 102, other regions (including at least the leading end portion 105 of crystal growth) where the catalytic element exists at a high concentration are removed by etching.

Conventionally, the arrangement of the catalytic element introduction region is determined so that a region which becomes an active layer of a TFT in a subsequent step exists in the region sandwiched between the leading end portion 105 of the crystal growth and the beltlike catalytic element introduction region 102, and a heat treatment condition for crystallization is determined.

Conventionally, it has been considered to be appropriate that the arrangement of the catalytic element introduction region is determined so that the region which becomes the active layer of the TFT in the subsequent step exists in the region sandwiched between the leading end portion of the crystal growth and the catalytic element introduction region. Besides, even if the catalytic element is removed in a step subsequent to crystallization, since it is difficult to completely remove the catalytic element, it has been considered to be sufficient if a necessary minimum amount of catalytic element is introduced.

Thus, one catalytic element introduction region has been provided at one side of the region which becomes the active layer of the TFT in the subsequent step. Note that a crystal growth velocity at 570° C. in the case where only one catalytic element introduction region (width w=10 $\mu$m) was disposed was about 3 $\mu$m/hr.

SUMMARY OF THE INVENTION

The present inventors paid attention to the fact that crystal growth conditions greatly depend on the width of a catalytic element introduction region and an arrangement interval, and found a method for effectively performing crystal growth as compared with a conventional technique.

An object of the present invention is to provide a semiconductor device and a method of fabricating the same in which a heat treatment time required for crystal growth is shortened as compared with a conventional technique and a process is simplified.

Another object of the present invention is to provide a semiconductor device and a method of fabricating the same in which catalytic element introduction regions are effectively arranged in a small space, to meet requirements in recent years that a circuit is made minute and is integrated.

A structure of the present invention disclosed in the present specification relates to a semiconductor device comprising a TFT provided on a substrate having an insulating surface, characterized in that an active layer of the TFT is made of a crystalline semiconductor film formed through crystal growth from a plurality of regions where a catalytic element for promoting crystallization is introduced, the active layer of the TFT includes a channel forming region, a source region, and a drain region, and the source region or drain region includes a boundary portion of regions formed through crystal growth from the plurality of regions.

That is, in the present invention, it is characterized in that at least one of active layer of the TFT includes a first region that has been crystal grown from one region where a catalytic element is introduced and a second region that has been crystal grown from another region where a catalytic element is introduced.

Further, another structure of the present invention relates to a semiconductor device comprising a TFT provided on a substrate having an insulating surface, characterized in that an active layer of the TFT is made of a crystalline semiconductor film formed through crystal growth from a plurality of regions where a catalytic element for promoting crystallization is introduced, the active layer of the TFT includes a plurality of channel forming regions, and a region sandwiched between the plurality of channel forming regions includes a boundary portion of regions formed through crystal growth from the plurality of regions.

Still further, another structure of the present invention relates to a semiconductor device comprising a CMOS circuit constituted by an n-channel TFT and a p-channel TFT on a substrate having an insulating surface, characterized in that an active layer of each of the n-channel TFT and the p-channel TFT is made of a crystalline semiconductor film formed through crystal growth from a plurality of regions where a catalytic element for promoting crystallization is introduced, the active layer of each of the n-channel TFT and the p-channel TFT includes a channel forming region, a source region, and a drain region, and the source region or drain region of the n-channel TFT includes a boundary portion of regions formed through crystal growth from the plurality of regions.

Yet further, another structure of the present invention relates to a semiconductor device comprising a CMOS circuit constituted by an n-channel TFT and a p-channel TFT on a substrate having an insulating surface, characterized in that an active layer of each of the n-channel TFT and the p-channel TFT is made of a crystalline semiconductor film formed through crystal growth from a plurality of regions where a catalytic element for promoting crystallization is introduced, the active layer of each of the n-channel TFT and the p-channel TFT includes a channel forming region, a source region, and a drain region, and the source region or drain region of the p-channel TFT includes a boundary portion of regions formed through crystal growth from the plurality of regions.

In the above-mentioned respective structures, it is characterized in that the boundary portion is formed in a region where a region formed through crystal growth from a first region where the catalytic element is introduced collide with a region formed through crystal growth from a second region where the catalytic element is introduced.

Further, in the above-mentioned respective structures, it is characterized in that the boundary portion has a linear shape.

In addition, a structure of the present invention realizing the above-mentioned structure relates to a method of fabricating a semiconductor device, comprising the steps of: forming an amorphous semiconductor film; introducing a catalytic element for promoting crystallization in the amorphous semiconductor film selectively; forming a boundary portion by a heat treatment to cause crystal growth from a plurality of regions where the catalytic element is introduced; removing or reducing the catalytic element existing in a region formed through crystal growth; and forming an active layer of a TFT by using the region where the catalytic element is removed or reduced.

Further in the above-mentioned structure, it is characterized in that the step of selectively introducing the catalytic element is carried out by using a mask having an opening portion for exposing a part of the amorphous semiconductor film, and the mask includes a plurality of opening portions at both sides of the boundary portion.

Still further, in the above-mentioned respective structure, it is characterized in that a source region or drain region of the TFT including the boundary portion is formed.

Yet further, in the above-mentioned respective structure, it is characterized in that a channel forming region of the TFT is formed between the opening portion and the boundary portion.

Furthermore, in the above-mentioned respective structure, it is characterized in that the catalytic element for promoting crystallization is one kind or plural kinds of elements selected from the group consisting of Ni, Fe, Co, Cu, Ge, and Pd.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIGS. 8A to 8E are views showing fabrication steps.

FIGS. 9A to 9E are views showing fabrication steps.

FIGS. 18A to 18F are views showing examples of electronic apparatuses.

FIGS. 19A to 19D are views showing examples of electronic apparatuses.

DETAILED DESCRIPTION OF THE INVENTION

In the present specification, a technique for effectively carrying out crystal growth by determining the arrangement of catalytic element introduction regions will be described below.

Figure 1A:
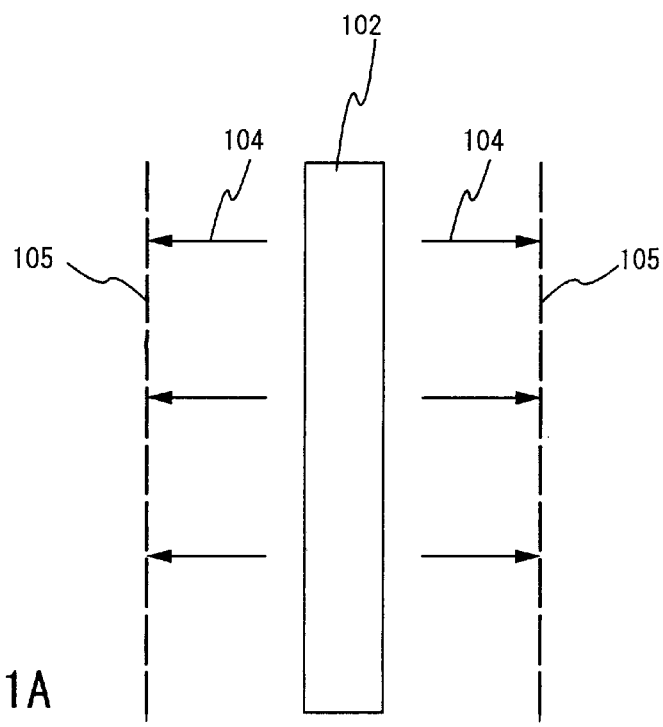
FIGS. 1A and 1B are views showing crystal growth from a catalytic element introduction region.
Figure 1B:
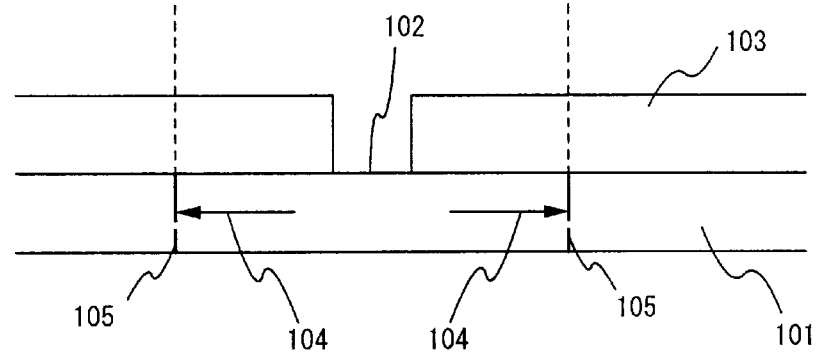
Figure 2A:
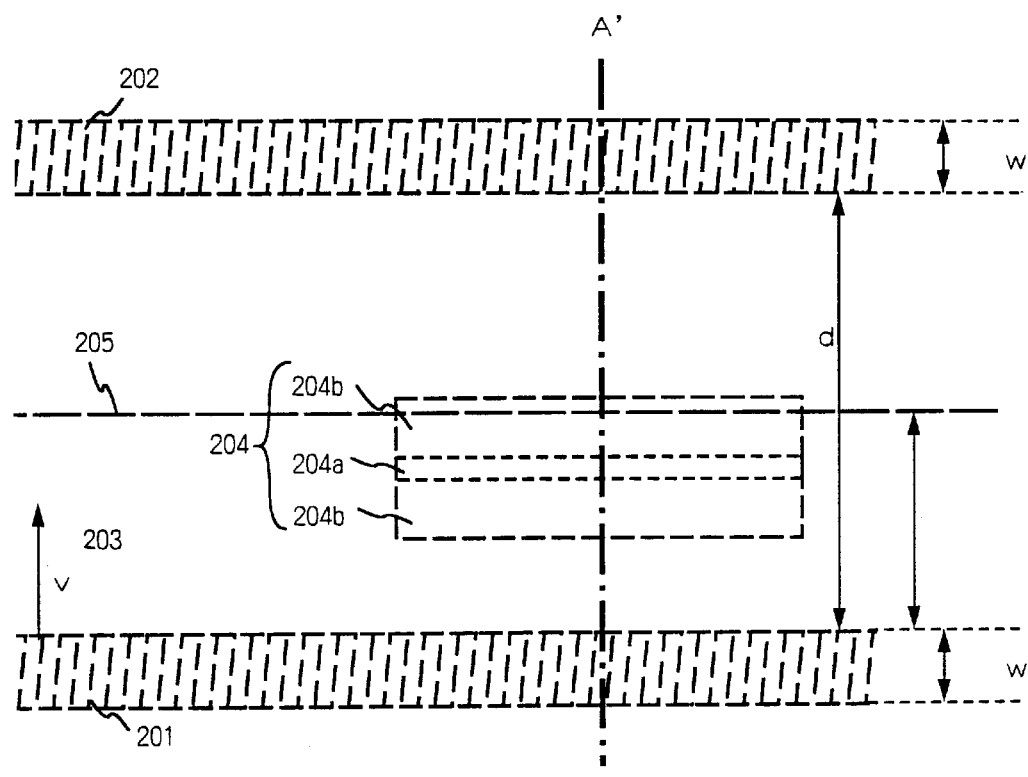
FIGS. 2A and 2B are views showing an example of the arrangement of catalytic element introduction regions.
Figure 2B:
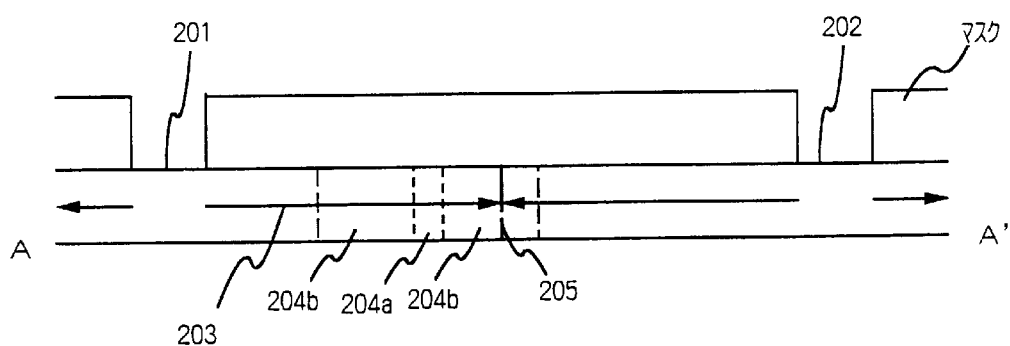

The present inventors have made an experiment in which as shown in FIGS. 2A and 2B, crystallization is made while two catalytic element introduction regions 201 and 202 are arranged at both sides of one active layer 204.

If crystallization is made in the state where the region 204 which becomes an active layer of a TFT in a subsequent step is sandwiched between the two catalytic element introduction regions 201 and 202, crystals mutually grow from one catalytic element introduction region to the other catalytic element introduction region. Note that it is assumed that the catalytic element introduction regions 201 and 202 are arranged so that the position of a channel forming region 204a of the TFT exists in a region sandwiched between the catalytic element introduction region 201 and a leading end portion 205 of the crystals grown from that. The leading end portion 205 is located in one of source and drain regions 204b.

First, an amorphous silicon film having a thickness of 65 nm and a silicon oxide film having a thickness of 150 nm were laminated. Next, in order to introduce a catalytic element in the catalytic element introduction regions 201 and 202, opening portions reaching the amorphous silicon film were formed in the silicon oxide film. Beltlike regions on the silicon film surface exposed through the opening portions become the catalytic element introduction regions 201 and 202.

Next, nickel was used as a catalytic element for promoting crystal growth, and a nickel acetate ethanol solution including the nickel element of 10 ppm in terms of weight was used to introduce the nickel element into the catalytic element introduction regions. Finally, a heat treatment at 570° C. was carried out to make crystal growth.

Thereafter, after a phosphorus element was doped (dose amount was made $2 \times 10^{15}$ atoms/cm$^2$), a heat treatment (gettering) at 600° C. for 12 hours was carried out to reduce the nickel element.

In FIGS. 2A and 2B, a crystal growth velocity in a crystal growth direction 203 (direction from one catalytic element introduction region 201 to the other catalytic element introduction region, 202) is denoted by v, and an interval distance between the two catalytic element introduction regions 201 and 202 is denoted by d. Besides, the width of each of the catalytic element introduction regions 201 and 202 is denoted by w. Here, a heat treatment for crystallization was carried out for the case of w=10 μm and the case of w=30 μm.

Figure 3:
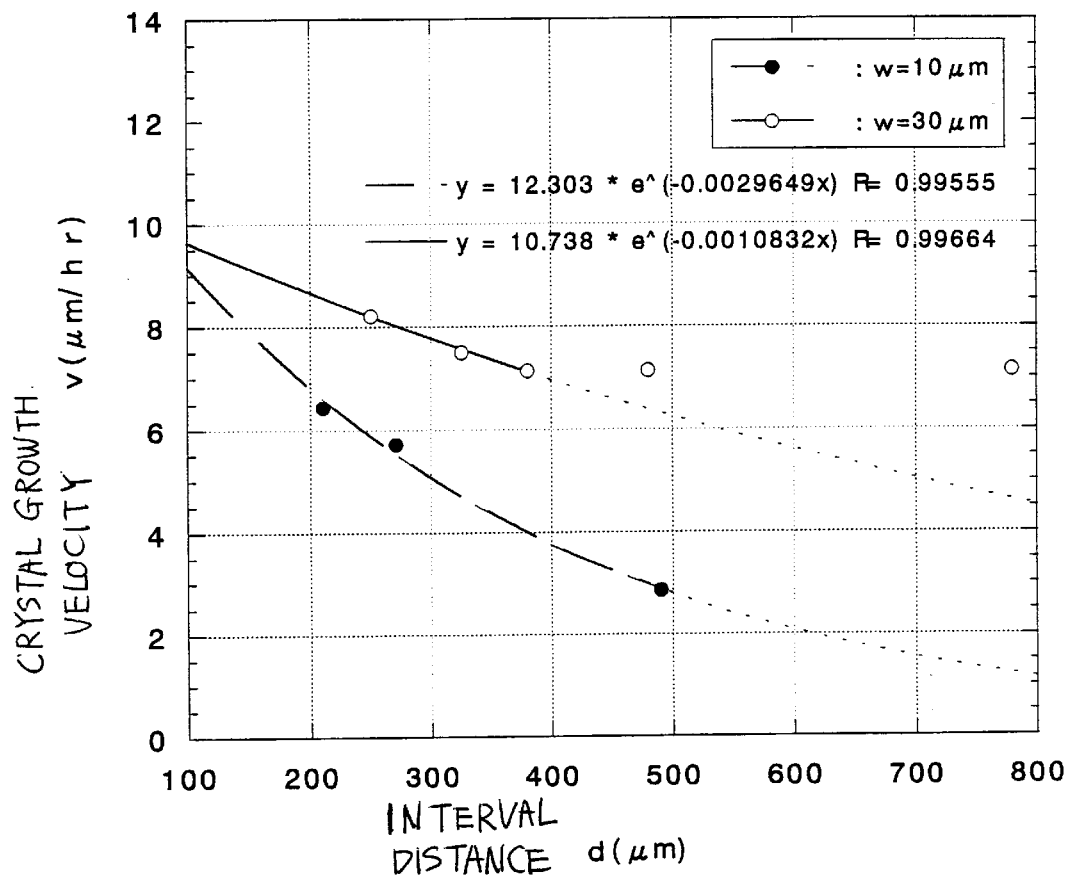
FIG. 3 is a view showing the relation between an interval distance d and a crystal growth velocity v.
Figure 21:
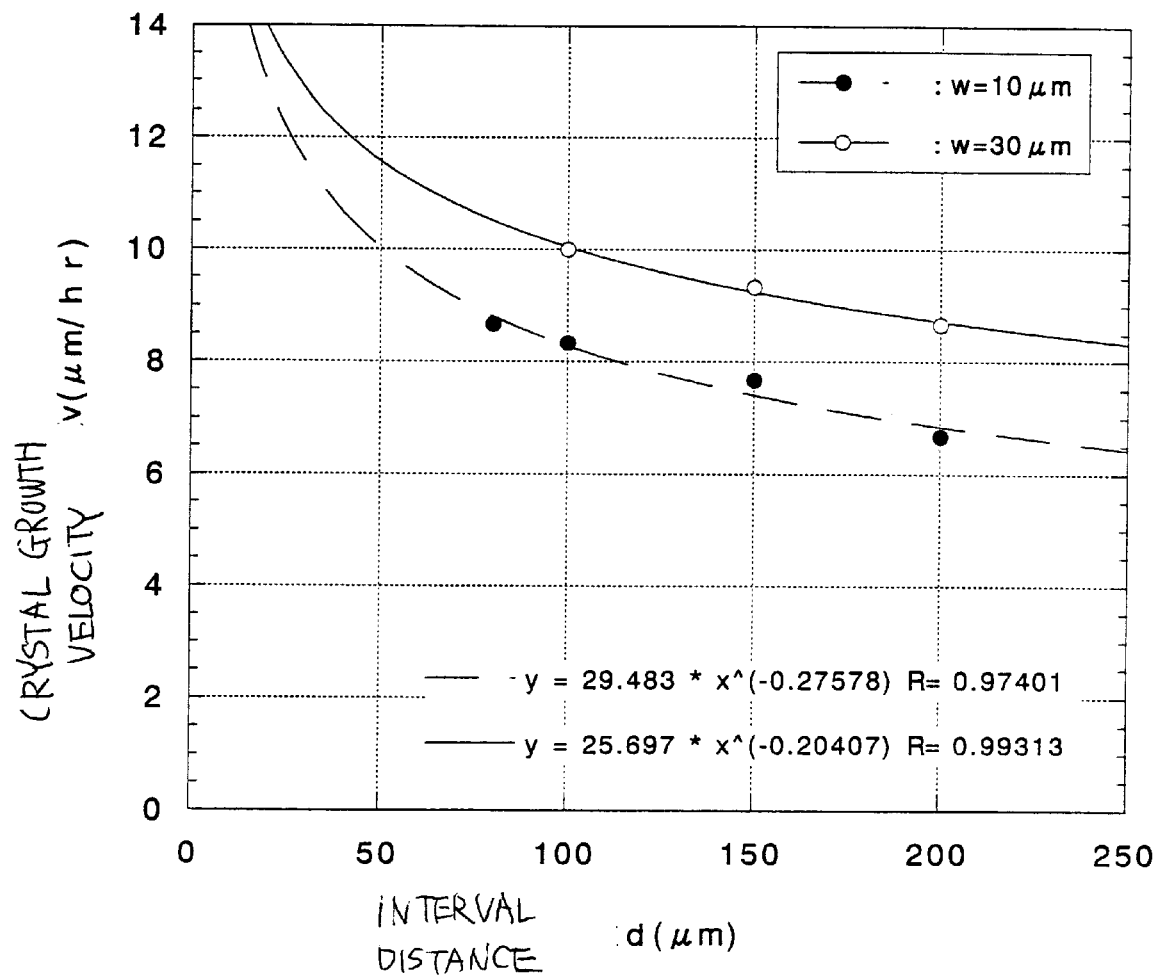
FIG. 21 is a view showing the relation between an interval distance d and a crystal growth velocity v.

In the above condition, FIG. 3 and FIG. 21 show graphs in which the crystal growth velocity v is calculated from the value of the interval distance d of the region sandwiched between the two catalytic element introduction regions. As is apparent from FIG. 3, the crystal growth velocity v depends on the interval distance d, and in the range of the interval distance d<400 μm, as the interval distance d becomes large, the crystal growth velocity v becomes low. However, when the interval distance d exceeds 400 μm, there is a tendency for the crystal growth velocity v to become saturated. The value of the saturated crystal growth velocity v is almost equal to a crystal growth velocity when only one catalytic element introduction region is arranged and crystallization is made.

In this way, the present inventors found that the crystal growth condition greatly depends on the interval distance d between the two catalytic element introduction regions. Besides, the crystal growth velocity in the direction from the catalytic element introduction region 202 to the catalytic element introduction region 201 also depends on the interval distance d.

Thus, if two catalytic element introduction regions are arranged at both sides of a desired region, and its interval distance d is made small, crystallization of the desired region can be made effectively and in a short time. However, in the case where the widths of the two catalytic element introduction regions are equal to each other, the interval distance d is equal to about twice the crystal growth distance. In addition, the interval distance d satisfies the following inequality: d<2×((interval between the catalytic element introduction region 201 and the region 204 which becomes the active layer)+(width of the region 204 which becomes the active layer in the crystal growth direction 203)).

As the width w of the catalytic element introduction region becomes wide, the crystal growth velocity v becomes high. Thus, if the width w of the catalytic element introduction region is made wide, crystallization can be made effectively and in a short time.

Note that even if parameters such as heat treatment conditions were changed, the relation established between the crystal growth velocity v and the interval distance d was not changed.

Figure 4A:
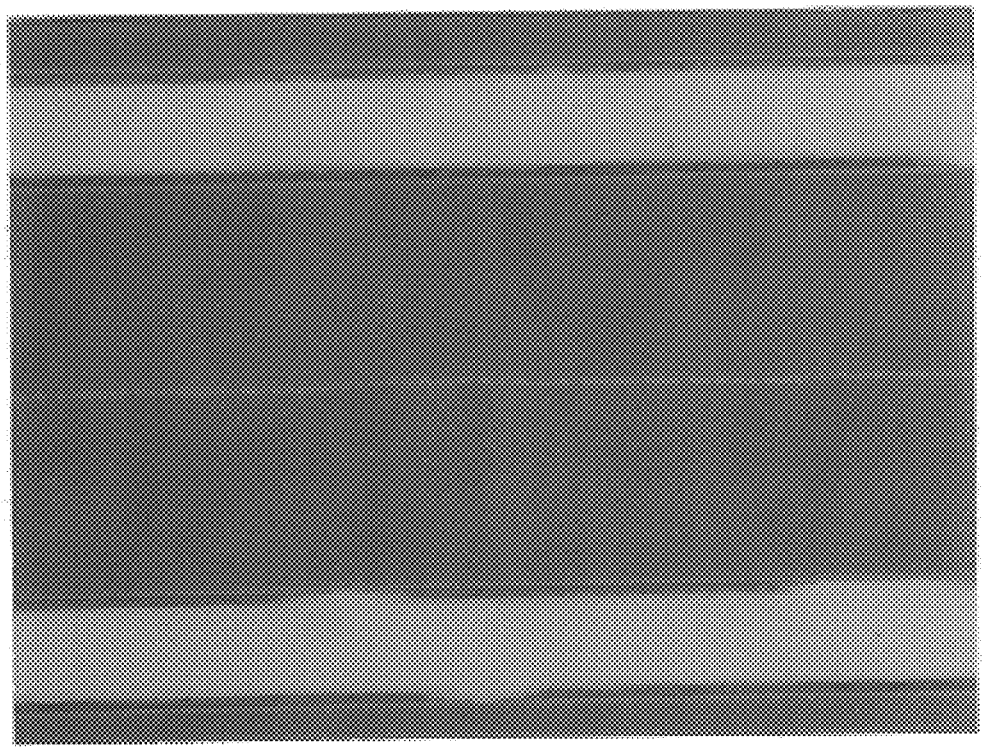
FIGS. 4A is a view of a microscope observation photograph showing a boundary portion and FIG. 4B is its schematic view.
Figure 4B:
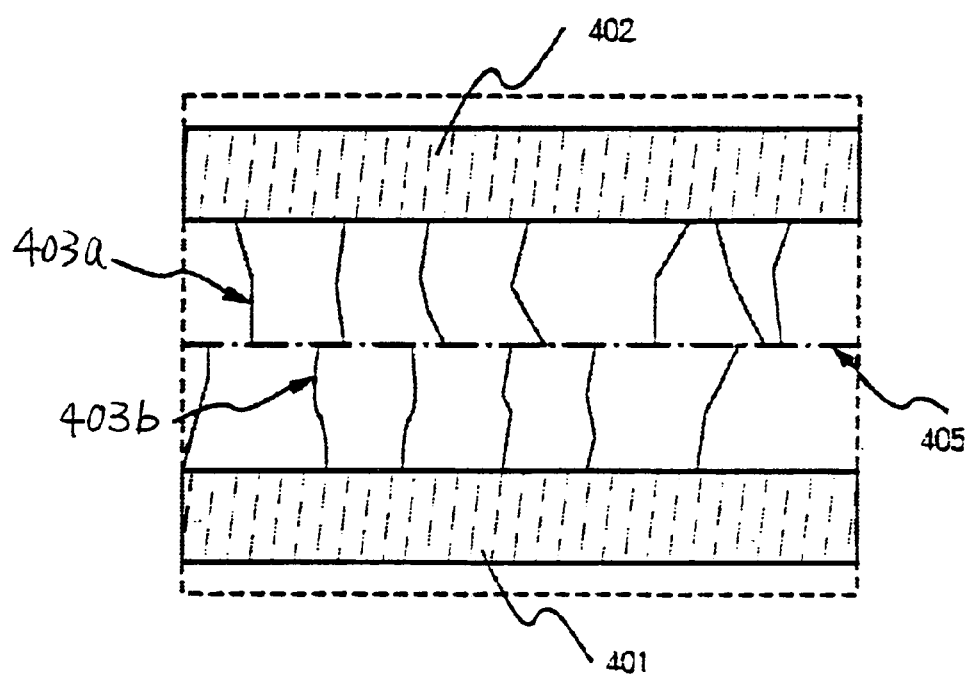

Like this, in the case where two catalytic element introduction regions (having the same width w) are arranged at both sides of a desired region and crystal growth is made, crystal growths meet each other at the intermediate position of the two catalytic element introduction regions. This state can be observed by a microscope, and a region where a crystal grain boundary by the crystal growth from one side is not coincident with a crystal grain boundary from the other side extends linearly. Immediately after the crystal growth, since the catalytic element is segregated at the region where the crystal growths meet each other, if etching is carried out, the segregated portion (region where the crystal growths meet each other) can be observed in more detail. FIG. 4A shows a photograph of the microscope observation and FIG. 4B is a schematic view thereof. Although the region where the crystal growths meet each other can be said as one of crystal grain boundaries, unlike crystal grain boundaries 403a and 403b seen in FIG. 4B, a linear pattern having a length of several μm or more can be clearly seen. In order to distinguish it from a general crystal grain boundary, in the present specification, the region where crystal growths meet each other will be referred to as a boundary portion 405.

Two catalytic element introduction regions 401 and 402 were arranged so that the boundary portion 405 formed a part of a source region or drain region of a TFT, and after crystallization was made in a short time, a gettering step of reducing a catalytic element was carried out to fabricate the TFT, and an experiment to compare its characteristics was carried out. As a result, it was found that TFT characteristics were not particularly changed.

On the other hand, in the case where the boundary portion 405 is arranged in a channel forming region of the TFT, there occur such harmful effects that TFT characteristics are deteriorated, and a threshold becomes high.

In the case where the two catalytic element introduction regions 401 and 402 are arranged so that the boundary portion 405 forms a part of the source region or drain region of the TFT, the active layer forming the TFT is made of a crystal region including the crystal grain boundary 403b caused by crystal growth from the region 401, and a crystal region including the crystal grain boundary 403a caused by crystal growth from the region 402. In this case, as compared with the case of forming an active layer made of only a crystal region grown from one catalytic element introduction region, a time required for crystallization can be shortened. Like this, it is very important to shorten a time required for crystal growth in view of simplifying a process.

In the present invention, when the arrangement was made so that a margin to some extent was formed between the boundary portion 405 and the channel forming region of the TFT, it was possible to shorten a time required for crystallization without changing the TFT characteristics. However, in view of the fact that the boundary portion 405 has fluctuation of about 1 μm in deviation σ from the center portion, it is desirable that the margin is made 2 μm or more.

Conventionally, since a heat treatment exceeding 10 hours is carried out, if the temperature is made higher than 570° C., a nucleus (natural nucleus) independent on the catalytic element comes to be easily produced, and the TFT characteristics are deteriorated. However, if the structure of the invention is adopted, since crystallization is made in a shorter time, even if the temperature is raised (about 1 to 10° C.), production of the natural nucleus is hard to cause, and an excellent crystalline semiconductor film with less fluctuation can be obtained.

That is, the present invention is characterized in that the boundary portion formed by crystal growth from the two catalytic element introduction regions is positioned in a region other than a channel forming region of a TFT, preferably in a source region or drain region.

Besides, in the case where after the crystallization is carried out, an element having a gettering function, typically phosphorus is added in the two catalytic element introduction regions arranged at both sides of the desired region at the small interval distance d, and heating is made to reduce the catalytic element, it is possible to carry out gettering of the desired region effectively and in a short time.

Figure 22:
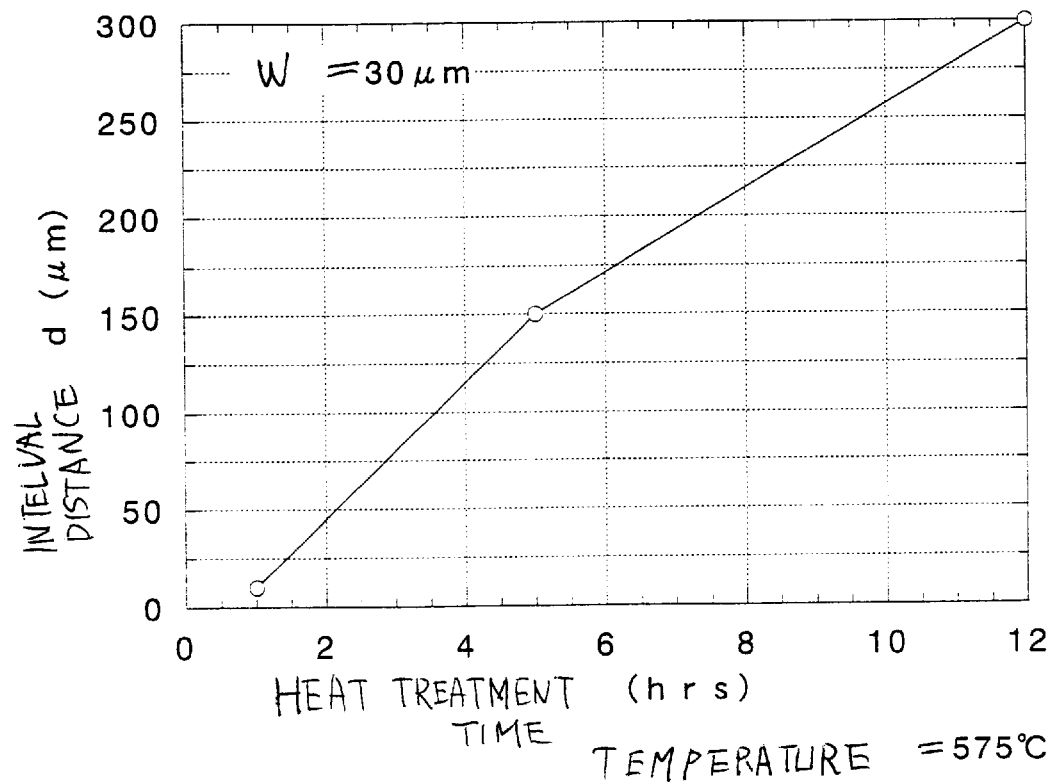
FIG. 22 is a view showing the relation between an interval distance d and a gettering requirement time.

FIG. 22 is a graph showing the relation between the interval distance d of a region sandwiched between two catalytic element introduction region and the heat treatment time (heating temperature of 575° C.) required for gettering.

Like this, it is very important to shorten the time required for gettering in view of simplifying the process.

Hereinafter, a mode of carrying the invention will be described.

Consideration will be given to the case where an amorphous silicon film is crystallized by using, for example, the same condition (the thickness of the amorphous silicon film is 65 nm, the initial thickness of a silicon oxide film used for a mask for catalytic element introduction is 150 nm, and a nickel acetate ethanol solution including a nickel element of 10 ppm in terms of weight is added to form a catalytic element introduction region) as the above condition where the relation of FIG. 3 is obtained.

Figure 5:
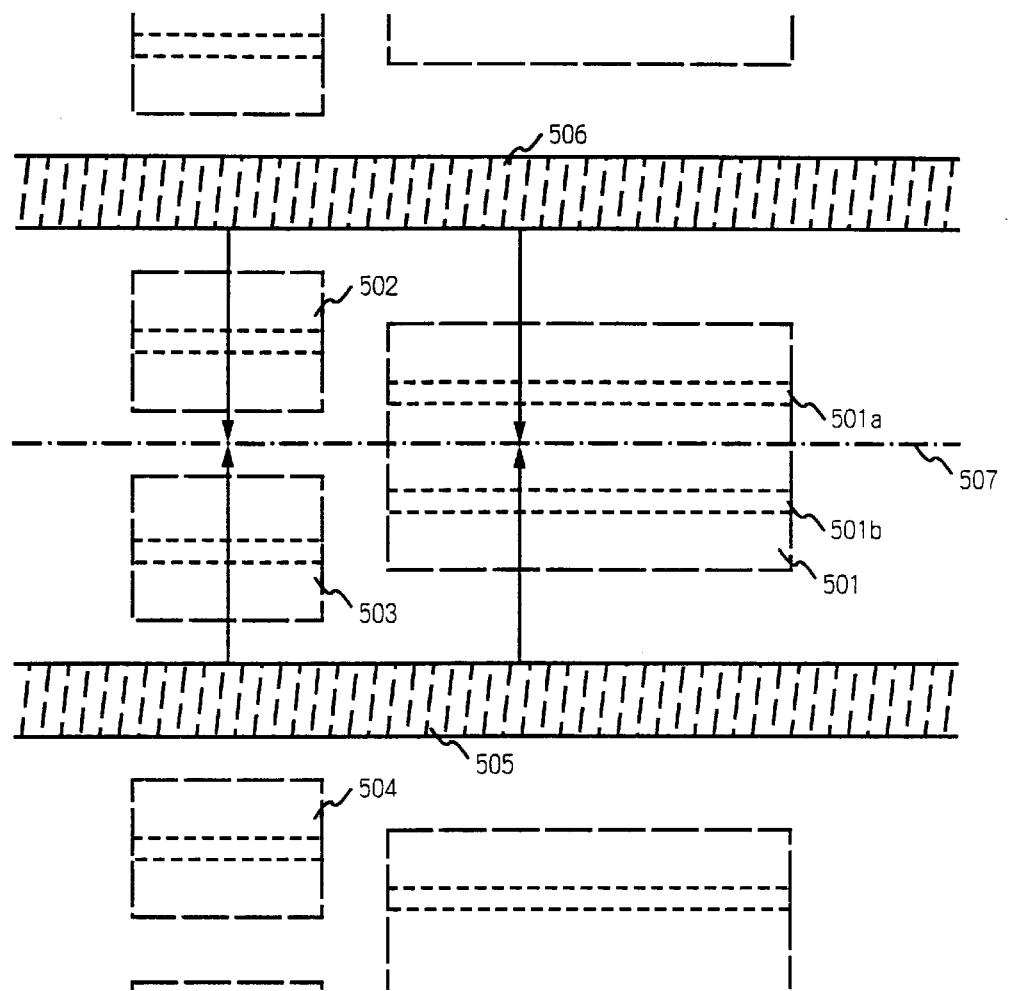
FIG. 5 is a view showing an example of the arrangement of catalytic element introduction regions and the arrangement of active layer regions.

FIG. 5 is a view showing a state immediately after crystallization caused by carrying out a heat treatment at 570° C. after an amorphous silicon film is formed, and catalytic element introduction regions 505 and 506 are formed by using a mask made of a silicon oxide film.

As shown in FIG. 5. regions 501, 502, and 503 which become active layers are arranged. The size of the region 501 which becomes the active layer is made a long side of 65 μm and a short side of 45 μm, and the size of each of the regions 502 and 503 which become the active layers is made a long side of 30 μm and a short side of 28 μm.

Note that a margin between the regions 502 and 503 which become the active layers is made 2 μm, and the catalytic element introduction region 505 with a width w=10 μm is arranged. The interval distance d from the catalytic element introduction region 505 is made 80 μm and it is arranged in parallel with the catalytic element introduction region 506.

In the case where a heat treatment at 570° C. is carried out, as shown in FIG. 5, the crystal growth from one catalytic element introduction region 505 meets the crystal growth from the other catalytic element introduction region 506 at the center portion, and a boundary portion 507 is formed. When the margin of 2 μm is considered in view of fluctuation of the position where the boundary portion 507 is formed, a crystal growth distance from one catalytic element introduction region is 42 μm (80 μm÷2 +2 μm).

Besides, a crystal growth velocity v from the catalytic element introduction region having the width w=10 μm at 570° C. is 6.4 μm/hr. Thus, a heat treatment time needed to obtain a crystalline silicon film becomes 6.6 hours.

Note that a region where the region 501 which becomes the active layer overlaps with the boundary portion 507 becomes a drain region. It is important that channel forming regions 501a and 501b do not overlap with the boundary portion 507.

Each of the regions 502 and 503 which become the active layers does not overlap with the boundary portion 507.

Further, if the heat treatment temperature is raised, it becomes possible to further shorten the heat treatment time. For example, when the heat treatment temperature is made 580° C. instead of 570° C., since the crystal growth velocity v is 9.5 μm/hr, it becomes possible to make crystallization in 4.4 hours.

If the width w of the catalytic element introduction region is made large. it becomes possible to make crystallization in a shorter time.

After crystallization is carried out in a short time, a gettering step of reducing the catalytic element is carried out, so that crystalline silicon having excellent crystallinity is obtained. A TFT is formed by using a crystalline silicon film obtained in this way and a circuit as shown in FIGS. 6A to 6C or FIGS. 7A to 7C may be formed. Note that in FIG. 6A, the same characters as those of FIG. 5 are used. Although the catalytic element introduction regions 505 and 506 are shown by dotted lines in FIG. 6A, actually, slight traces merely remain.

Figure 6A:
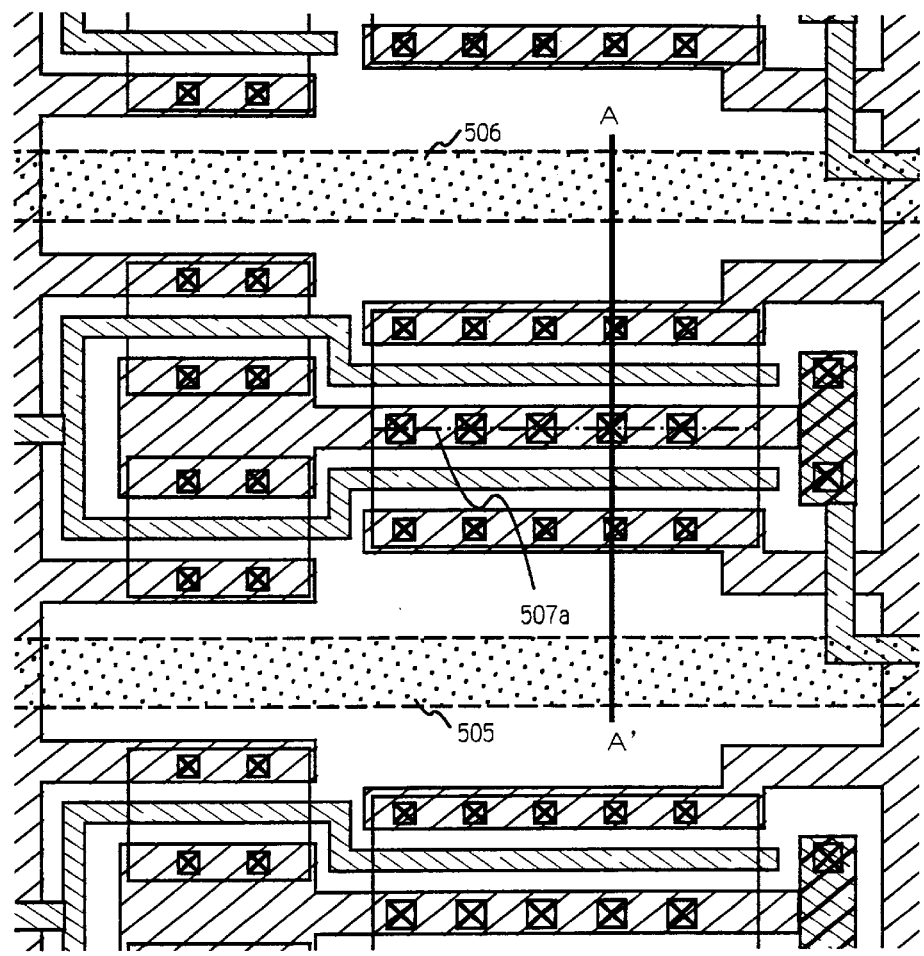
FIGS. 6A to 6C are views showing an example of an inverter circuit.
Figure 6B:
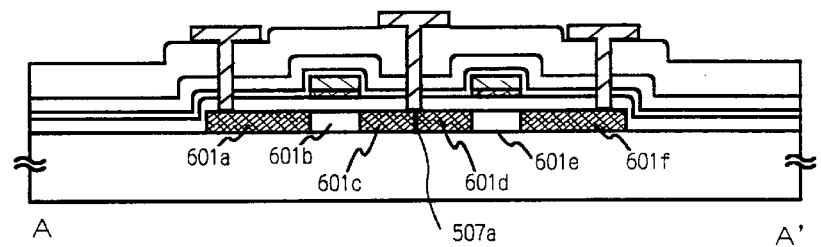

FIG. 6B is an A–A' sectional view. In FIG. 6B, active layers 601a to 601c are regions where crystal growth was made from the catalytic element introduction region 506, and active layers 601d to 601f are regions where crystal growth was made from the catalytic element introduction region 505. Besides, the drawing shows a region (boundary portion) 507a where the crystal growth from the catalytic element introduction region 506 meets the crystal growth from the catalytic element introduction region 505.

Figure 6C:
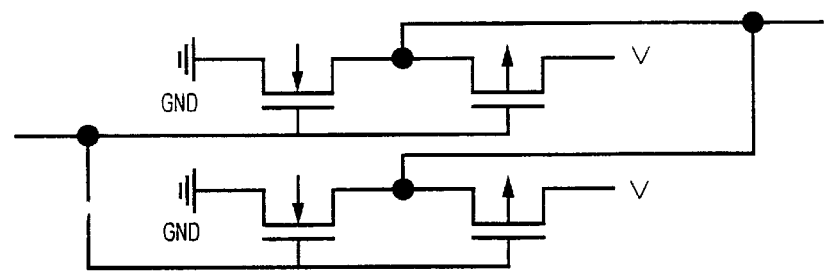

Note that the circuit shown in FIGS. 6A and 6B is an inverter circuit, and its equivalent circuit is shown in FIG. 6C.

Figure 7A:
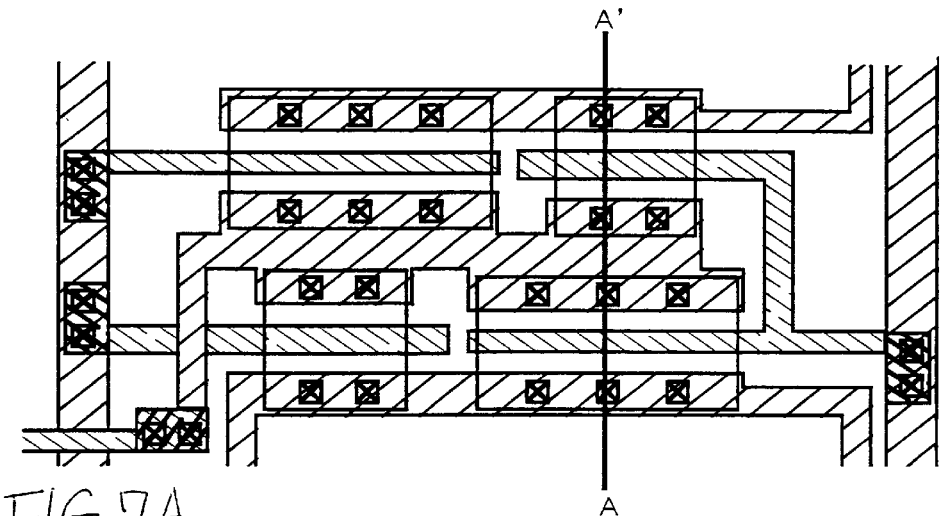
FIGS. 7A to 7D are views showing an example of a CMOS circuit.
Figure 7B:
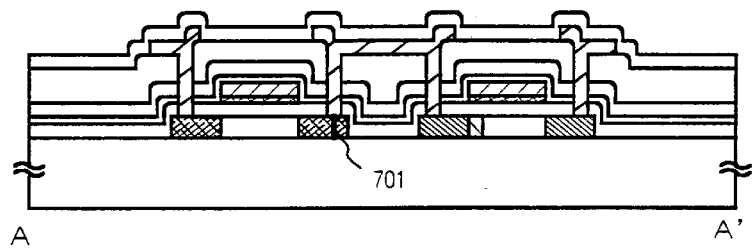

FIG. 7A shows an example of a CMOS circuit. FIG. 7B shows an A–A' sectional view. The drawings show an example in which two catalytic element introduction regions (not shown) are arranged so that a region 701 where crystal growths meet each other exists in a drain region of a p-channel TFT. The two catalytic element introduction regions may be arranged so that distances to the region 701 become equal to each other, or it is also possible to design in such a manner that the widths of the catalytic element introduction regions are made different from each other and the region 701 exists in the drain region of the p-channel TFT. In the case where the widths are made different, the position of the region 701 is shifted from the center portion of the interval of the catalytic element introduction regions.

Figure 7C:
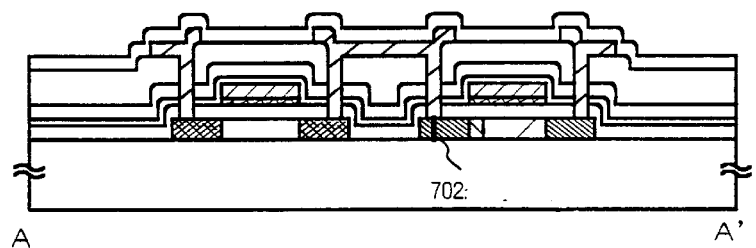
Figure 7D:
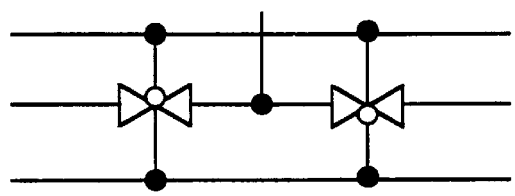

FIG. 7C shows an example in which two catalytic element introduction regions (not shown) are arranged so that a region 702 where crystal growths meet each other exists in a drain region of an n-channel TFT.

Like this, the freedom of arrangement of two catalytic element introduction regions is high, and it is possible to shorten a time required for crystallization by using this.

The present invention having the foregoing structure will be described in more detail with reference to embodiments shown below.

Embodiment 1

In this embodiment, with respect to the structure of the invention, a method of fabricating an active matrix type substrate in which a pixel portion and a CMOS circuit as a base of a driver circuit provided at a periphery thereof are formed at the same time, will be described with reference to FIGS. 8A to 14.

In FIG. 8A, it is desirable to use a glass substrate, a quartz substrate, or a silicon substrate as a substrate 801. In this embodiment, the quartz substrate was used. Other than those, a metal substrate or what is obtained by forming an insulating film on a stainless substrate may be used as the substrate. In the case of this embodiment, since heat resistance capable of withstanding a temperature of 800° C. or higher is required, as long as a substrate satisfies that, any substrate may be used.

A semiconductor film 802 having a thickness of 20 to 100 nm (preferably 40 to 80 nm) and comprising amorphous structure is formed on the surface of the substrate 801 on which a TFT is to be formed, by a low pressure thermal CVD method, a plasma CVD method, or a sputtering method. Note that in this embodiment, although an amorphous silicon film having a thickness of 60 nm is formed, since a thermal oxidation step is carried out later, this thickness does not become the final thickness of a TFT.

The semiconductor film comprising the amorphous structure includes an amorphous semiconductor film, and a microcrystalline semiconductor film, and further, a compound semiconductor film comprising amorphous structure, such as an amorphous silicon germanium film. Further, it is also effective to continuously form an under film and an amorphous silicon film on the substrate without opening to the air. By doing so, it becomes possible to prevent pollution on the substrate surface from influencing the amorphous silicon film, and fluctuation in characteristics of a TFT fabricated can be reduced.

Next, a mask film 803 made of an insulating film including silicon is formed on the amorphous silicon film 802, and opening portions 804a and 804b are formed by patterning. A beltlike region on the surface of the amorphous silicon film exposed through the opening portion becomes a catalytic element introduction region for introducing a catalytic element for promoting crystallization at a subsequent crystallizing step (FIG. 8A).

The position of the catalytic element introduction region becomes important in the subsequent crystallizing step. Although not shown in this embodiment, a margin of 2 μm from a region which became an active layer was taken and a beltlike first catalytic element introduction region (width w=10 μm) was arranged. Then, a second catalytic element introduction region was arranged at a side of the active layer opposite to the first catalytic element introduction region. By use of FIGS. 3 and 31, an operator may determine an interval distance d between the first catalytic element introduction region and the second catalytic element introduction region and a width w of the catalytic element introduction region. In this embodiment, the interval distance was made d=80 μm, and the width was made w=10 μm. However, it is not necessary that the interval distance d or the width w is made the same for all regions, but the operator may suitably determine the values in view of circuit arrangement.

Note that as the insulating film including silicon, a silicon oxide film, a silicon nitride film, or a silicon nitride oxide film may be used. The silicon nitride oxide film is an insulating film including silicon, nitrogen, and oxygen at a specific ratio, and is an insulating film expressed by SiOxNy. The silicon nitride oxide film can be formed by $SiH_4$, $N_2O$, and $NH_3$, as raw material gases, and it is appropriate that the concentration of nitrogen included is made not less than 25 atomic % and less than 50 atomic %.

At the same time as patterning of the mask film 803, a marker pattern as a reference in a subsequent patterning step is formed. Although the amorphous silicon film 802 is slightly etched when the mask film 803 is etched, this difference in level can be used as the marker pattern later at the time of adjusting a mask.

Next, a semiconductor film comprising crystal structure is formed in accordance with a technique disclosed in Japanese Patent Unexamined Publication No. Hei. 10-247735 (corresponding to U.S. patent application No. 09/034,041). The technique disclosed in the publication is crystallizing means using a catalytic element (one kind or plural kinds of elements selected from nickel, cobalt, germanium, tin, lead, palladium, iron, and copper) for promoting crystallization at the time of crystallization of a semiconductor film comprising amorphous structure.

Specifically, a heat treatment is carried out in a state where a catalytic element is held on the surface of a semiconductor film comprising amorphous structure, so that the semiconductor film comprising the amorphous structure is changed into a semiconductor film comprising crystalline structure. Note that as crystallization means, a technique disclosed in embodiment 1 of Japanese Patent Unexamined Publication No. Hei. 7-130652 may be used. Although the semiconductor film comprising the crystalline structure includes both a so-called single crystal semiconductor film and a polycrystalline semiconductor film, the semiconductor film comprising the crystalline structure formed in the publication includes a crystal grain boundary.

Note that in the publication, although a spin coating method is used when a layer including the catalytic element is formed on a mask film, a thin film including the catalytic element may be formed by using a vapor phase method such as a sputtering method or vapor deposition method.

Although depending on a hydrogen content, it is desirable that an amorphous silicon film is subjected to a heat treatment at 400 to 550° C. for about 1 hour to sufficiently remove hydrogen, and then, crystallization is made. In that case, it is preferable that the hydrogen content is made 5 atom % or less.

In the crystallizing step, first, a heat treatment at 400 to 500° C. for about 1 hour is carried out to remove hydrogen from a film, and then, a heat treatment at 500 to 650° C. (preferably 550 to 600° C.) for 3 to 16 hours (preferably 5 to 14 hours) is carried out.

In this embodiment, nickel was used as a catalytic element, and the widths and positions of the catalytic element introduction regions were devised as described above, so that it was possible to make crystallization by a heat treatment at 570° C. for 6.6 hours. As a result, crystallization proceeded in the direction (direction shown by an arrow) parallel with the substrate from the opening portions 804a and 804b as start points, and semiconductor films (in this embodiment, crystalline silicon films) 805a to 805d comprising crystal structure, in which macroscopic crystal growth directions were regular, were formed (FIG. 8B). Note that a boundary portion of the films 805b and 805c is a region where crystal growths meet each other, and nickel exists at a relatively high concentration. Besides, the catalytic element introduction regions are arranged so that crystal growths meet each other also in the films 805d and 805a.

Next, a gettering step for removing nickel used in the crystallizing step from the crystalline silicon film is carried out. In this embodiment, the previously formed mask film 803 is used as a mask as it is, and a step of adding an element (in this embodiment, phosphorus) in group 15 is carried out, so that phosphorus added regions (hereinafter referred to as gettering regions) 806a and 806b including phosphorus at a concentration of $1\times10^{19}$ to $1\times10^{20}$ atoms/cm$^3$ are formed in the crystalline silicon film exposed through the opening portions 804a and 804b (FIG. 8C).

Next, a heat treatment step at 450 to 650° C. (preferably 500 to 550° C.) for 4 to 24 hours, preferably 6 to 12 hours, is carried out in a nitrogen atmosphere. By this heat treatment, nickel in the crystalline silicon film is moved in the direction of an arrow, and is captured in the gettering regions 806a and 806b by the gettering function of phosphorus. That is, since nickel is removed from the crystalline silicon film, the concentration of nickel included in crystalline silicon films 807a to 807d after gettering can be reduced to $1\times10^{17}$ atms/cm$^3$ or less, preferably $1\times10^{16}$ atms/cm$^3$.

Next, the mask film 803 is removed, and a protective film 808 for the time of subsequent impurity addition is formed on the crystalline silicon films 807a to 807d. As the protective film 808, it is appropriate that a silicon nitride oxide film or silicon oxide film having a thickness of 100 to 200 nm (preferably 130 to 170 nm) is used. This protective film 808 has meanings to prevent the crystalline silicon films from being directly exposed to plasma at the time of impurity addition, and to enable subtle concentration control.

Then, a resist mask 809 is formed thereon, and an impurity element to give a p type (hereinafter referred to as a p-type impurity element) is added through the protective film 808. As the p-type impurity element, typically an element in group 13, exemplarily boron or gallium can be used. This step (called a channel doping step) is a step for controlling a threshold voltage of a TFT. Here, boron is added by an ion doping method in which diborane ($B_2H_6$) is plasma excited without performing mass separation. Of course, an ion implantation method in which mass separation is performed may be used.

By this step, impurity regions 810a and 810b including the p-type impurity element (in this embodiment, boron) at a concentration of $1\times10^{15}$ to $1\times10^{18}$ atoms/cm$^3$ (typically $5\times10^{16}$ to $5\times10^{17}$ atoms/cm$^3$) are formed. Note that in the present specification, an impurity region including the p-type impurity element in the above concentration range (however, the region does not include phosphorus) is defined as a p-type impurity region (b) (FIG. 8D).

Next, the resist mask 809 is removed, and the crystalline silicon films are patterned to form island-like semiconductor layers (hereinafter referred to as active layers) 811 to 814. Although not shown, when the crystalline silicon films are etched, the substrate or the under film provided on the substrate is also slightly etched. Thus, traces of arrangement of the catalytic element introduction regions slightly remain.

Note that the active layers 811 to 814 are formed of crystalline silicon films having very excellent crystallinity by selectively introducing nickel to make crystallization. Specifically, the respective films have such crystal structure that rod-like or column-like crystals are arranged with specified directionality. After crystallization, nickel is removed or reduced by the gettering function of phosphorus, and the concentration of the catalytic element remaining in the active layers 811 to 814 is $1\times10^{17}$ atms/cm$^3$ or less, preferably $1\times10^{16}$ atms/cm$^3$ (FIG. 8E).

The active layer 811 of a p-channel TFT is a region which does not include an intentionally introduced impurity element, and the active layers 812 to 814 of n-channel TFTs are p-type impurity regions (b). In the present specification, it is defined that all of the active layers 811 to 814 in this state are intrinsic or substantially intrinsic. That is, it may be considered that a region where an impurity element is intentionally introduced to such a degree as not to obstruct the operation of a TFT, is a substantially intrinsic region.

Next, an insulating film including silicon and having a thickness of 10 to 100 nm is formed by a plasma CVD method or sputtering method. In this embodiment, a silicon nitride oxide film having a thickness of 30 nm is formed. As the insulating film including silicon, another insulating film including silicon may be used as a single layer or a laminate layer.

Next, a heat treatment step at a temperature of 800 to 1150° C. (preferably 900 to 1000° C.) for 15 minutes to 8 hours (preferably 30 minutes to 2 hours) is carried out in an oxidizing atmosphere (thermal oxidation step). In this embodiment, a heat treatment step at 950° C. for 80 minutes is carried out in an atmosphere of an oxygen atmosphere added with hydrogen chloride of 3 vol %. Note that boron added in the step of FIG. 8D is activated in this thermal oxidation step (FIG. 9A).

Note that as the oxidizing atmosphere, although both a dry oxygen atmosphere and a wet oxygen atmosphere may be used, the dry oxygen atmosphere is suitable for reducing crystal defects in a semiconductor layer. Besides, although this embodiment uses the atmosphere in which the halogen element is included in the oxygen atmosphere, the heat treatment step may be carried out in a 100% oxygen atmosphere.

During this thermal oxidation step, an oxidizing reaction proceeds also at interfaces between the insulating film including silicon and the active layers 811 to 814 thereunder. In the present invention, in view of that, adjustment is made so that the thickness of a finally formed gate insulating film 815 becomes 50 to 200 nm (preferably 100 to 150 nm). In the thermal oxidation step of this embodiment, a layer of 25 nm in the active layer having a thickness of 60 nm is oxidized so that the thickness of each of the active layers 811 to 814 becomes 35 nm. Besides, since a thermal oxidation film having a thickness of 50 nm is added to the insulating film having a thickness of 30 nm and including silicon, the thickness of the final gate insulating film 815 becomes 105 nm.

Next, resist masks 816 to 819 are newly formed. Then, an impurity element to give an n type (hereinafter referred to as an n-type impurity element) is added to form impurity regions 820 to 822 exhibiting an n type. As the n-type impurity element, typically an element in group 15, exemplarily phosphorus or arsenic can be used (FIG. 9B).

The impurity regions 820 to 822 are impurity regions which are made to subsequently function as LDD regions in n-channel TFTs of a CMOS circuit and a sampling circuit. Note that in the impurity regions formed here, the n-type impurity element is included at a concentration of $2\times10^{16}$ to $5\times10^{19}$ atoms/cm$^3$ (typically $5\times10^{17}$ to $5\times10^{18}$ Amos/cm$^3$). In the present specification, an impurity region including an n-type impurity element in the above concentration range is defined as an n-type impurity region (b).

Here, phosphorus is added at a concentration of $1\times10^{18}$ atoms/cm$^3$ by an ion doping method in which phosphine (PH$_3$) is plasma excited without performing mass separation. Of course, an ion implantation method in which mass separation is performed may be used. In this step, phosphorus is added in the crystalline silicon films through the gate film 815.

Next, a heat treatment is carried out in an inert gas atmosphere at 600 to 1000° C. (preferably 700 to 800° C.), and phosphorus added in the step of FIG. 9B is activated. In this embodiment, a heat treatment at 800° C. for 1 hour is carried out in a nitrogen atmosphere (FIG. 9C).

At this time, it is possible to repair the active layers damaged at the time of addition of phosphorus and the interfaces between the active layers and the gate insulating film at the same time. Although it is preferable to use furnace annealing using an electric heating furnace in this activating step, light annealing such as lamp annealing or laser annealing may be used at the same time.

By this step, boundary portions of the n-type impurity regions (b) 820 to 822, that is, contact portions to the intrinsic or substantially intrinsic regions (of course. including the p-type impurity regions (b) as well) existing around the n-type impurity regions (b) become clear. This means that at the point of time when a TFT is later completed, an LDD region and a channel forming region can form a very excellent contact portion.

Next, a conductive film which becomes a gate wiring line is formed. Although the gate wiring line may be formed of a conductive film of a single layer, as needed, it is preferable to form a laminate film such as a two-layer or three-layer film. In this embodiment, a laminate film made of a first conductive film 823 and a second conductive film 824 is formed (FIG. 9D).

Here, as the first conductive film 823 and the second conductive film 824, a conductive film including an element selected from tantalum (Ta), titanium (Ti), molybdenum (Mo), tungsten (W), chromium (Cr), and silicon (Si), or including the above element as its main ingredient (typically, a tantalum nitride film, tungsten nitride film, or titanium nitride film), or an alloy film made of combination of the foregoing elements (typically a Mo-W alloy film, Mo-Ta alloy film, tungsten silicide film, etc.) may be used.

Note that it is appropriate that the thickness of the first conductive film 823 is made 10 to 50 nm (preferably 20 to 30 nm), and the thickness of the second conductive film 824 is made 200 to 400 nm (preferably 250 to 350 nm). In this embodiment, a tungsten nitride (WN) film having a thickness of 50 nm is used as the first conductive film 823, and a tungsten film having a thickness of 350 nm is used as the second conductive film 824. Although not shown, it is effective that a silicon film having a thickness of about 2 to 20 nm is formed under the first conductive film 823. By this, adhesiveness of the conductive film formed thereon can be improved, and oxidation can be prevent.

Besides, it is also effective to use a tantalum nitride film as the first conductive film 823, and a tantalum film as the second conductive film.

Next, the first conductive film 823 and the second conductive film 824 are etched together to form gate wiring lines 825 to 828 each having a thickness of 400 nm. At this time, the gate wiring lines 826 and 827 formed in the driver circuit are formed to overlap with part of the n-type impurity regions (b) 820 to 822 through the gate insulating film 815. The overlapping portions subsequently become Lov regions. Note that although gate wiring lines 828a and 828b are seen to be two in the section, they are actually formed of one continuously connected pattern (FIG. 9E).

Figure 10A:
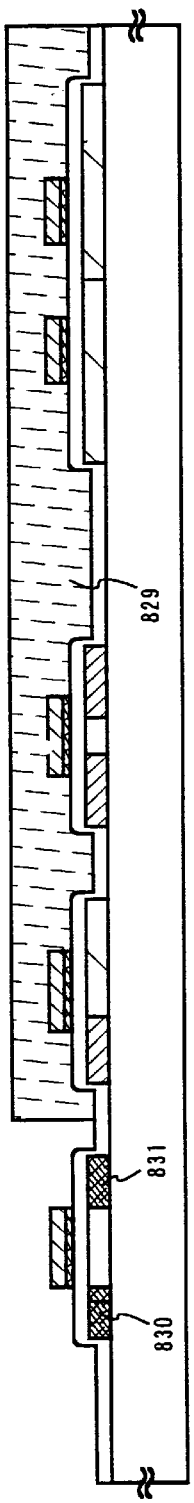
FIGS. 10A to 10D are views showing fabrication steps.

Next, a resist mask 829 is formed, and a p-type impurity element (in this embodiment, boron) is added to form impurity regions 830 and 831 including boron at a high concentration. In this embodiment, boron is added at a concentration of $3\times10^{20}$ to $3\times10^{21}$ atoms/cm$^3$ (typically $5\times10^{20}$ to $1\times10^{21}$ atoms/cm$^3$) by an ion doping method using diborane (B$_2$H$_6$) (of course, an ion implantation method may be used). In the present specification, an impurity region including a p-type impurity element in the foregoing concentration range is defined as a p-type impurity region (a) (FIG. 10A).

Figure 10B:
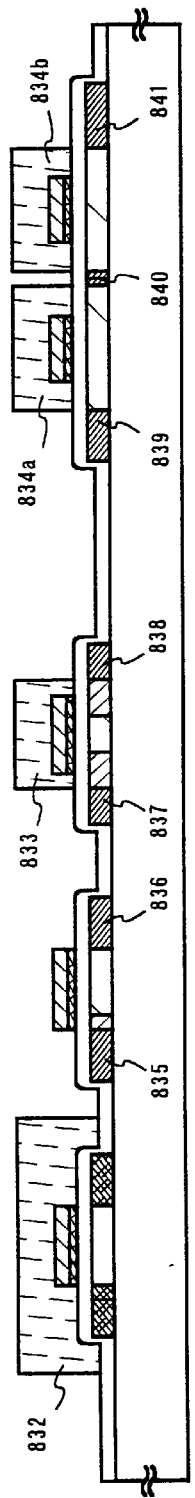

Next, the resist mask 829 is removed, and resist masks 832 to 834 are formed to cover gate wiring lines and regions which becomes p-channel TFTs. Then, an n-type impurity element (in this embodiment, phosphorus) is added to form impurity regions 835 to 841 including phosphorus at a high concentration. Also in this step, an ion doping method using phosphine (PH$_3$) (of course, an ion implantation method may be used) is used, and the concentration of phosphorus in the regions is made $1\times10^{20}$ to $1\times10^{22}$ atoms/cm$^3$ (typically, $2\times10^{20}$ to $5\times10^{21}$ atoms/cm$^3$) (FIG. 10B).

Note that in the present specification, an impurity region including an n-type impurity element in the foregoing concentration range is defined as an n-type impurity region (a). Although phosphorus or boron already added in the previous step is included in the regions where the impurity regions 835 to 841 are formed, since phosphorus is added at a sufficiently high concentration, it is not necessary to consider the influence of phosphorus or boron added in the previous step. Thus, it is permissible to reword the impurity regions 835 to 841 as n-type impurity regions (a).

Next, the resist masks 832 to 834 are removed, and a cap film 842 made of an insulating film including silicon is formed. It is appropriate that its thickness is made 25 to 100 nm (preferably 30 to 50 nm). In this embodiment, a silicon nitride film having a thickness of 25 nm is used. Although the cap film 842 functions also as a protective film to prevent oxidation of the gate wiring lines in a subsequent activation step, if the film is made too thick, stress becomes strong and disadvantage such as film peeling occurs, so that it is preferable that the thickness is made 100 nm or less.

Figure 10C:
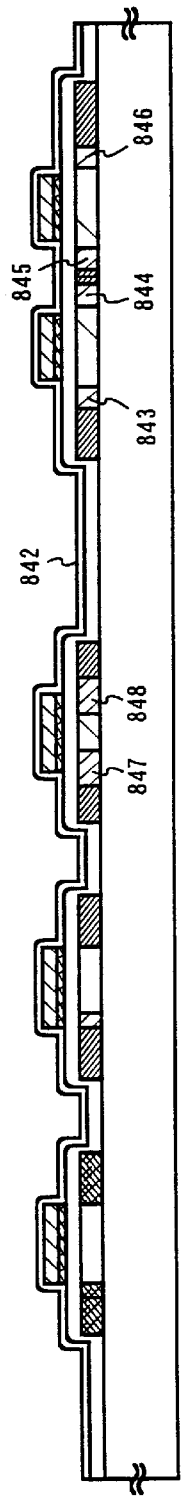

Next, an n-type impurity element (in this embodiment, phosphorus) is added in a self-aligning manner with the gate wiring lines 825 to 828 as masks. Adjustment is made so that phosphorus is added in impurity regions 843 to 846 thus formed at a concentration of ½ to 1/10 (typically ⅓ to ¼) of that of the n-type impurity region (b) (however, the concentration is 5 to 10 times as high as the concentration of boron added in the foregoing channel doping step, typically $1 \times 10^{16}$ to $5 \times 10^{18}$ atoms/cm$^3$, and exemplarily $3 \times 10^{17}$ to $3 \times 10^{18}$ atoms/cm$^3$). Note that in the present specification, an impurity region (except for the p-type impurity region (a)) including an n-type impurity element in the above concentration range is defined as an n-type impurity region (c) (FIG. 10C).

In this step, phosphorus is added through the insulating film (laminate film of the cap film 842 and the gate insulating film 815) having a thickness of 105 nm, and the cap film formed at side walls of the gate wiring lines 834a and 834b also functions as a mask. That is, an offset region with a length equal to the thickness of the cap film 842 is formed. Note that the term "offset region" indicates a high resistance region which is formed to be in contact with a channel forming region and is formed of a semiconductor film having the same composition as the channel forming region, but which does not form an inversion layer (channel forming region) since a gate voltage is not applied. In order to lower an off current value, it is important to suppress the overlap of an LDD region and a gate wiring line to the utmost, and in that meaning, it can be said that to provide the offset region is effective.

Note that as in this embodiment, in the case where the channel forming region also includes the p-type impurity element at a concentration of $1 \times 10^{15}$ to $1 \times 10^{18}$ atoms/cm$^3$, naturally, the offset region also includes the p-type impurity element at the same concentration.

Although the length of the offset region is determined by the thickness of the cap film actually formed at the side wall of the gate wiring line and a going around phenomenon (phenomenon in which an impurity is added so as to get into a region under a mask) at the time of adding the impurity element, from the viewpoint of suppressing the overlap of the LDD region and the gate wiring line, it is very effective to form the cap film previously at the time of forming the n-tape impurity region (c) as in this embodiment.

Note that in this step, although phosphorus is added at a concentration of $1 \times 10^{16}$ to $5 \times 10^{18}$ atoms/cm$^3$ in all impurity regions except portions concealed with the gate wiring lines, since the concentration is very low, it does not have an influence on the function of each impurity region. Although boron has been added at a concentration of $1 \times 10^{15}$ to $1 \times 10^{18}$ atoms/cm$^3$ in the n-type impurity regions (b) 843 to 846 in the channel doping step, since phosphorus is added in this step at a concentration 5 to 10 times as high as that of boron included in the p-type impurity regions (b), also in this case, it can be said that boron does not have an influence on the function of the n-type impurity regions (b).

However, strictly speaking, in the n-type impurity regions (b) 847 and 848, the concentration of phosphorus in the portion overlapping with the gate wiring line remains $2 \times 10^{16}$ to $5 \times 10^{19}$ atoms/cm$^3$, while in the portion not overlapping with the gate wiring line, phosphorus of a concentration of $1 \times 10^{16}$ to $5 \times 10^{18}$ atoms/cm$^3$ is added to that, and the portion includes phosphorus at a slightly higher concentration.

Next, a first interlayer insulating film 849 is formed. The first interlayer insulating film 849 is formed of an insulating film including silicon, specifically a silicon nitride film, a silicon oxide film, a silicon nitride oxide film, or a laminate film of combination of those. It is appropriate that its thickness is made 100 to 400 nm. In this embodiment, a silicon nitride oxide film (nitrogen concentration is 25 to 50 atomic %) having a thickness of 200 nm is formed by a plasma CVD method using $SiH_4$, $N_2O$, and $NH_3$ as raw material gases.

Figure 10D:
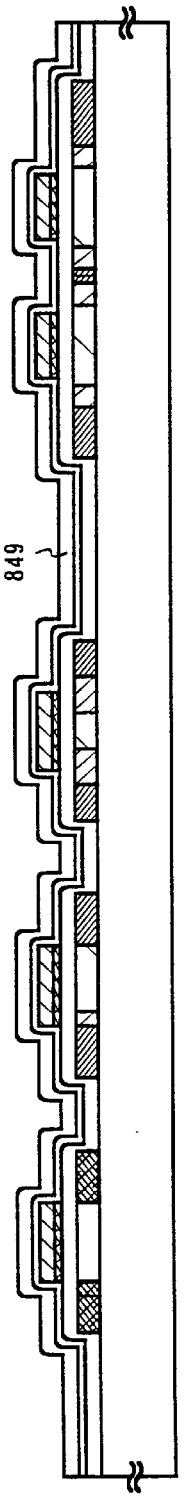

Thereafter, a heat treatment step for activating the n-type and p-type impurity elements added at each concentration is carried out. This step can be carried out by using a furnace annealing method, a laser annealing method, a lamp annealing method or a combination of those. In the case where this step is carried out by the furnace annealing method, it is appropriate that the step is carried out in an inert gas atmosphere at 500 to 800° C., preferably 550 to 600° C. In this embodiment, a heat treatment at 600° C. for 4 hours is carried out, so that the impurity elements are activated (FIG. 10D).

Note that in this embodiment, the gate wiring lines are covered in the state where the silicon nitride film 842 and the silicon nitride oxide film 849 are laminated, and the activation step is carried out in that state. In this embodiment, although tungsten is used as a wiring line material, it is known that a tungsten film is very weak to oxidation. That is, even, if oxidation is made while the tungsten film is covered with a protective film, if a pinhole exists in the protective film, it is immediately oxidized. However, in this embodiment, the silicon nitride film extremely effective as an oxidation resistant film is used, and the silicon nitride oxide film is laminated to the silicon nitride film, so that it is possible to carry out the activation step at a high temperature without paying attention to the problem of the pinhole on the silicon nitride film.

Next, after the activation step, a heat treatment at 300 to 450° C. for 1 to 4 hours is carried out in an atmosphere including hydrogen of 3 to 100% to hydrogenate the active layers. This step is a step of terminating dangling bonds of a semiconductor layer by thermally excited hydrogen. As other means for hydrogenating, plasma hydrogenating (using hydrogen excited by plasma) may be carried out.

When the activation step is ended, a second interlayer insulating film 850 having a thickness of 500 nm to 1.5 $\mu$m is formed on the first interlayer insulating film 849. In this embodiment, as the second interlayer insulating film 850, a silicon oxide film having a thickness of 800 nm is formed by a plasma CVD method. In this way, an interlayer insulating film made of a laminate film of the first interlayer insulating film (silicon nitride oxide film) 849 and the second interlayer insulating film (silicon oxide film) 850 and having a thickness of 1 $\mu$m is formed.

If there is no problem in view of heat resistance in a subsequent step, as the second interlayer insulating film 850, it is also possible to use an organic resin film of polyimide, acryl, polyamide, polyimidoamid, BCB (benzocyclobutene), or the like.

Figure 11A:
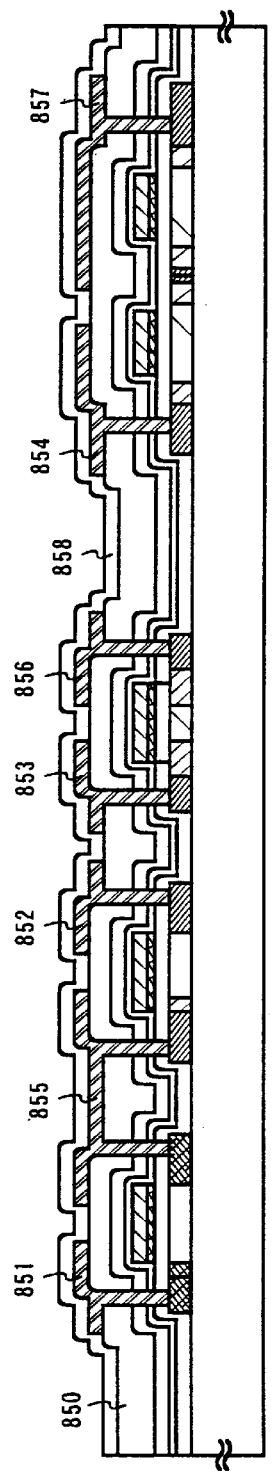
FIGS. 11A and 11B are views showing fabrication steps.

Thereafter, a contact hole reaching a source region or drain region of each TFT is formed, and source wiring lines 851 to 854 and drain wiring lines 855 to 857 are formed. Note that in order to form the CMOS circuit, the drain wiring line 855 is made common between the p-channel TFT and n-channel TFT. Although not shown, in this embodiment, this wiring line is made a laminate film of three-layer structure in which a Ti film having a thickness of 200 nm, an aluminum film including Ti and having a thickness of 500 nm, and a Ti film having a thickness of 100 nm are continuously formed by a sputtering method (FIG. 11A).

Next, as a passivation film 858, a silicon nitride film, a silicon oxide film, or a silicon nitride oxide film having a thickness of 50 to 500 nm (typically 200 to 300 nm) is formed. At this time, in this embodiment, prior to formation of the film, a plasma treatment is carried out by using a gas including hydrogen, such as $H_2$ or $NH_3$, and a heat treatment is carried out after film formation. Hydrogen excited by this pretreatment is supplied to the first and second interlayer insulating films. By carrying out the heat treatment in this state, the film quality of the passivation film 858 is improved, and since hydrogen added in the first and second interlayer insulating films is diffused to a lower layer side, the active layers can be effectively hydrogenated.

Besides, after the passivation film 858 is formed a hydrogenating step may be further carried out. For example, it is appropriate that a heat treatment at 300 to 450° C. for 1 to 12 hours is carried out in an atmosphere including hydrogen of 3 to 100%, or even if a plasma hydrogenating method is used, the same effect can be obtained. Note that at a position where a contact hole for connecting a pixel electrode with a drain wiring line is to be formed after the hydrogenating step, an opening portion (not shown) may be formed in the passivation film 858.

Thereafter, a third interlayer insulating film 859 made of organic resin and having a thickness of about 1 μm is formed. As the organic resin, polyimide, acryl, polyamide, polyimidoamid, BCB (benzocyclobutene) or the like may be used. As the merits of using the organic resin film, it is possible to enumerate such points that a film formation method is simple, parasitic capacitance can be reduced since a relative dielectric constant is low, and the film is excellent in flatness. Note that it is also possible to use a film of organic resin other than the above, an organic SiO compound or the like. Here, polyimide of a type in which thermal polymerization is made after application to the substrate is used, and is fired at 300° C. to form the film.

Next, in a region which becomes a pixel portion, a shielding film 860 is formed on the third interlayer insulating film 859. In the present specification, the term "shielding film" is used to mean shielding light and electromagnetic wave. The shielding film 860 is formed of a film including an element selected from aluminum (Al), titanium (Ti), and tantalum (Ta), or a film including any one element as its main ingredient and having a thickness of 100 to 300 nm. In this embodiment, an aluminum film including titanium of 1 wt % is formed to a thickness of 125 nm.

Note that when an insulating film, such as a silicon oxide film, having a thickness of 5 to 50 nm is formed on the third interlayer insulating film 859, the adhesiveness of a shielding film formed thereon can be raised. Besides, when a plasma treatment using a $CF_4$ gas is performed on the surface of the third interlayer insulating film 859 made of organic resin, the adhesiveness of a shielding film formed on the film can be improved by the improvement of surface quality.

Besides, by using the aluminum film including titanium, other connection wiring lines can also be formed in addition to the shielding film. For example, a connection wiring line connecting circuits can be formed in the driver circuit. However, in that case, before the film is formed of material for forming the shielding film or the connection wiring line, it is necessary to previously form a contact hole in the third interlayer insulating film.

Next, an oxide 861 having a thickness of 20 to 100 nm (preferably 30 to 50 nm) is formed on the surface of the shielding film 860 by an anodic oxidation method or plasma oxidation method (in this embodiment, the anodic oxidation method). In this embodiment, since the film including aluminum as its main ingredient is used as the shielding film 860, an aluminum oxide film (alumina film) is formed as the anodic oxide 861.

At the anodic oxidation treatment, first, a tartaric acid ethylene glycol solution having a sufficiently small alkaline ion concentration is prepared. This is a solution of a mixture of 15% of tartaric acid ammonium solution and ethylene glycol at a ratio of 2:8, and ammonia water is added to this, so that pH is adjusted to become 7±0.5. Then, a platinum electrode which becomes a cathode is provided in this solution, the substrate on which the shielding film 860 is formed is immersed in the solution, the shielding film 860 is made an anode, and a constant (several mA to several tens mA) dc current is made flow.

Although the voltage between the cathode and the anode in the solution is changed with a time in accordance with the growth of the anodic oxidation, the voltage is raised at a voltage rising rate of 100 V/min while constant current is kept, and when the voltage reaches an attained voltage of 45 V, the anodic oxidation treatment is ended. In this way, the anodic oxide 861 having a thickness of about 50 nm can be formed on the surface of the shielding film 860. As a result, the thickness of the shielding film 860 becomes 90 nm. Note that the numerical values relative to the anodic oxidation shown here are merely examples, and optimum values are naturally changed according to the size of a fabricated device or the like.

Besides, here, although such a structure is adopted that the insulating film is provided only on the surface of the shielding film by using the anodic oxidation method, the insulating film may be formed by a vapor phase method such as a plasma CVD method, a thermal CVD method, or a sputtering method. Also in that case, it is preferable that the thickness is made 20 to 100 nm (preferably 30 to 50 nm). Besides, a silicon oxide film, a silicon nitride film, a silicon nitride oxide film, a DLC (Diamond Like Carbon) film, a tantalum oxide film, or an organic resin film may be used. Further, a laminate film of a combination of these may be used.

Next, a contact hole reaching the drain wiring line 857 is formed in the third interlayer insulating film 859 and the passivation film 858, and a pixel electrode 862 is formed. Note that a pixel electrode 863 is a pixel electrode of an adjacent different pixel. As for the pixel electrodes 862 and 863, it is appropriate that a transparent conductive film is used in the case where a transmission type liquid crystal display device is formed, and a metal film is used in the case where a reflection type liquid crystal display device is formed. Here, in order to form the transmission type liquid crystal display device, an indium-tin oxide (ITO) film having a thickness of 110 nm is formed by a sputtering method.

At this time, the pixel electrode 862 and the shielding film 860 overlap with each other through the anodic oxide 861, and holding capacitor (storage capacitor) 864 is formed. In this case, it is desirable that the shielding film 860 is set to a floating state (electrically isolated state) or a fixed potential, preferably a common potential (intermediate potential of an image signal transmitted as data).

In this way, the active matrix substrate including the driver circuit and the pixel portion on the same substrate is completed. Note that in FIG. 11B, a p-channel TFT 1101, and n-channel TFTs 1102 and 1103 are formed in the driver circuit, and a pixel TFT. 1104 made of an n-channel TFT is formed in the pixel portion.

In the p-channel TFT 1101 of the driver circuit, a channel forming region 1001, a source region 1002, and a drain region 1003 are respectively formed of the p-type impurity region (a). However, strictly, the source region 1002 and the drain region 1003 include phosphorus at a concentration of $1 \times 10^{16}$ to $5 \times 10^{18}$ atoms/cm$^3$.

In the n-channel TFT 1102, a channel forming region 1004, a source region 1005, a drain region 1006, and a region 1007 overlapping with the gate wiring line through the gate insulating film (in the present specification, such a region is referred to as a Lov region. The index "ov" is added to mean "overlap") and positioned between the channel forming region and the drain region are formed. At this time, the Lov region 1007 includes phosphorus at a concentration of $2 \times 10^{16}$ to $5 \times 10^{19}$ atoms/cm$^3$, and is formed so that the whole overlaps with the gate wiring line.

In the n-channel TFT 1103, a channel forming region 1008, a source region 1009, a drain region 1010, and LDD regions 1011 and 1012 positioned at both sides of the channel forming region are formed. That is, the LDD regions are formed between the source region and the channel forming region, and between the drain region and the channel forming region.

Note that in this structure, since part of the LDD regions 1011 and 1012 overlap with the gate wiring line, a region (Lov region) overlapping with the gate wiring line through the gate insulating film and a region not overlapping with the gate wiring line (in the present specification, such a region is referred to as a Loff region. The index "off" is added to means "offset") are realized.

To the channel length of 3 to 7 $\mu$m, it is appropriate that the length (width) of the Lov region 1007 of the n-channel TFT 1102 is made 0.3 to 3.0 $\mu$m, typically 0.5 to 1.5 $\mu$m. Besides, it is appropriate that the length (width) of the Lov region of the n-channel TFT 1103 is made 0.3 to 3.0 $\mu$m, typically 0.5 to 1.5 $\mu$m, and the length (width) of the Loff region is made 1.0 to 3.5 $\mu$m, typically 1.5 to 2.0 $\mu$m. Besides it is appropriate that the length (width) of each of Loff regions 1017 to 1020 provided in the n-channel TFT 1104 of the pixel portion is made 0.5 to 3.5 $\mu$m, typically 2.0 to 2.5 $\mu$m.

In this embodiment, since the alumina film having a high dielectric constant of 7 to 9 is used as a dielectric of the storage capacitor, it is possible to lessen an occupied area of the storage capacitor required for forming necessary capacitance. Further, as in this embodiment, when the shielding film formed over the pixel TFT is made one electrode of the storage capacitor, the opening rate of an image display portion of the active matrix, type liquid crystal display device can be improved.

Note that it is not necessary to limit the invention to the structure of the storage capacitor shown in this embodiment. For example, it is also possible to use a storage capacitor of a structure disclosed in Japanese Patent Application Laid-open No. Hei. 11-133463, No. Hei. 11-97702, or U.S. patent application No. 09/356377 by the present assignee.

Figure 11B:
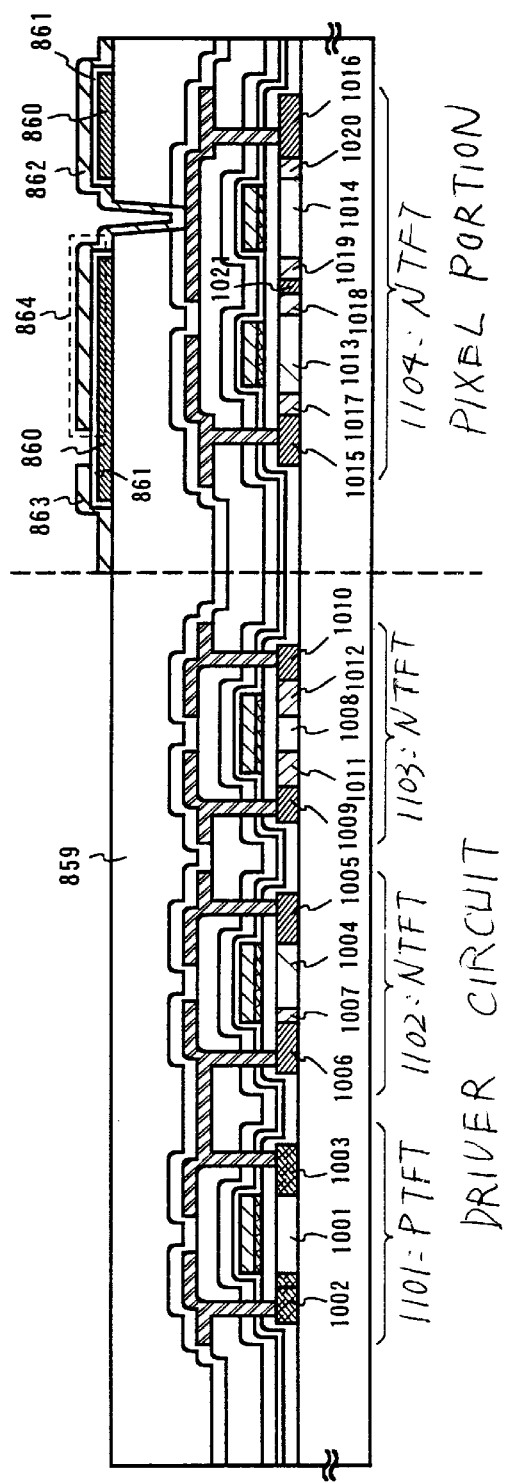
Figure 12:
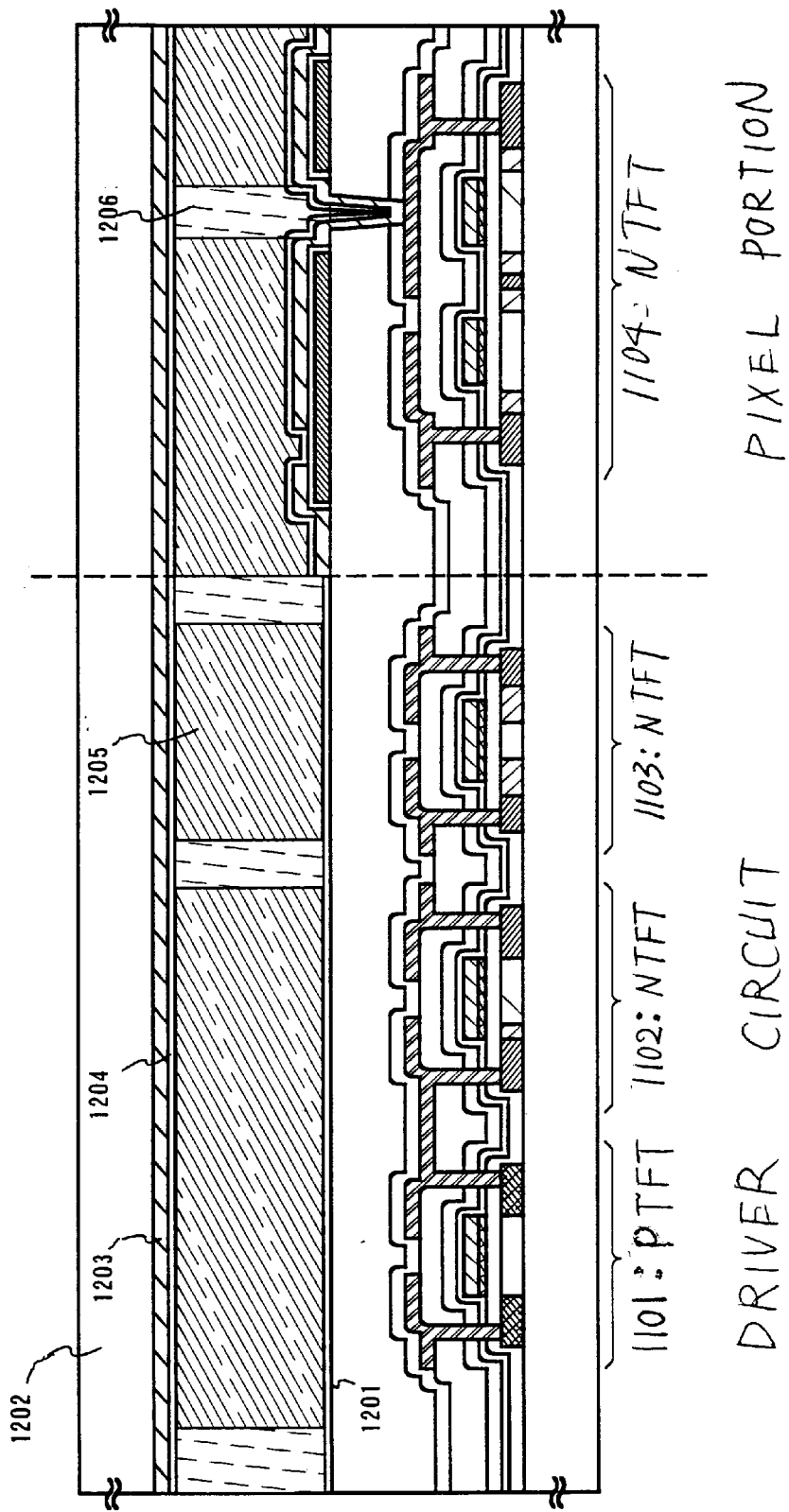
FIG. 12 is a view showing a sectional structure of a liquid crystal display device.

Next, a step of fabricating a liquid crystal display device from the above substrate will be described. As shown in FIG. 12, an oriented film 1201 is formed to the substrate on which the pixel portion and the driver circuit in the state of FIG. 11B are formed. In this embodiment, a polyimide film is used as the oriented film. An opposite electrode 1203 made of a transparent conductive film and an oriented film 1204 are formed on an opposite substrate 1202. Note that a color filter or a shielding film may be formed on the opposite substrate as needed.

Next, after the oriented film is formed, a rubbing treatment is performed to make adjustment so that liquid crystal molecules are oriented with a specific pre-tilt angle. Then, the substrate on which the pixel portion and the driver circuit are formed is bonded to the opposite substrate by a well-known cell assembling step through a seal material 1206, a spacer (not shown) or the like. The seal material is made to include resin and fiber. In order to prevent a short circuit, a column-like spacer is made not to overlap with an auxiliary capacitance portion. In the pixel portion, in order to reduce disclination, a column-like spacer is provided on the contact of the pixel electrode. Thereafter, a liquid crystal 1205 is injected between both the substrates, and both are completely sealed by a sealing agent (not shown). As the liquid crystal, a well known liquid crystal material may be used. In this way, the liquid crystal display device shown in FIG. 12 is completed.

Next, the structure of this liquid crystal display device will be described with reference to FIG. 13. Note that in FIG. 13, common characters are used to make the drawing correspond to the sectional structural view of FIG. 12. A pixel portion 1301, a gate side driver circuit 1302, and a source driver circuit 1303 are formed on a quartz substrate 801. A pixel TFT 1104 of a pixel portion is an n-channel TFT, and a driver circuit provided on the periphery is constructed by a CMOS circuit as a base. The gate side driver circuit 1302 and the source driver circuit 1303 are connected to the pixel portion 1301 through a gate wiring line 828 and a source wiring line 854, respectively. Besides, there are provided connection wiring lines 1306 and 1307 from an external input/output terminal 1305 to which an FPC 1304 is connected to input/output terminals of the driver circuits.

Figure 13:
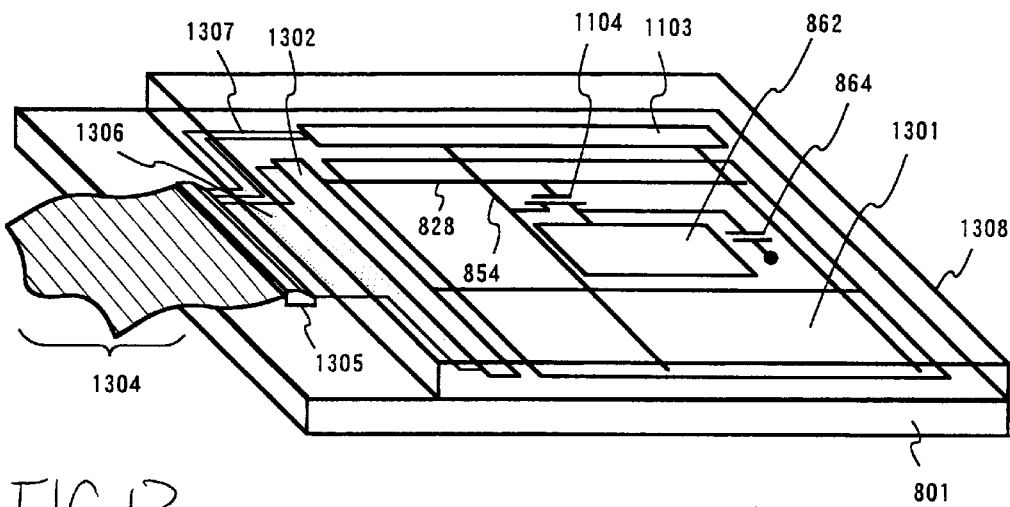
FIG. 13 is a view showing an outer appearance of an AM-LCD.
Figure 14:
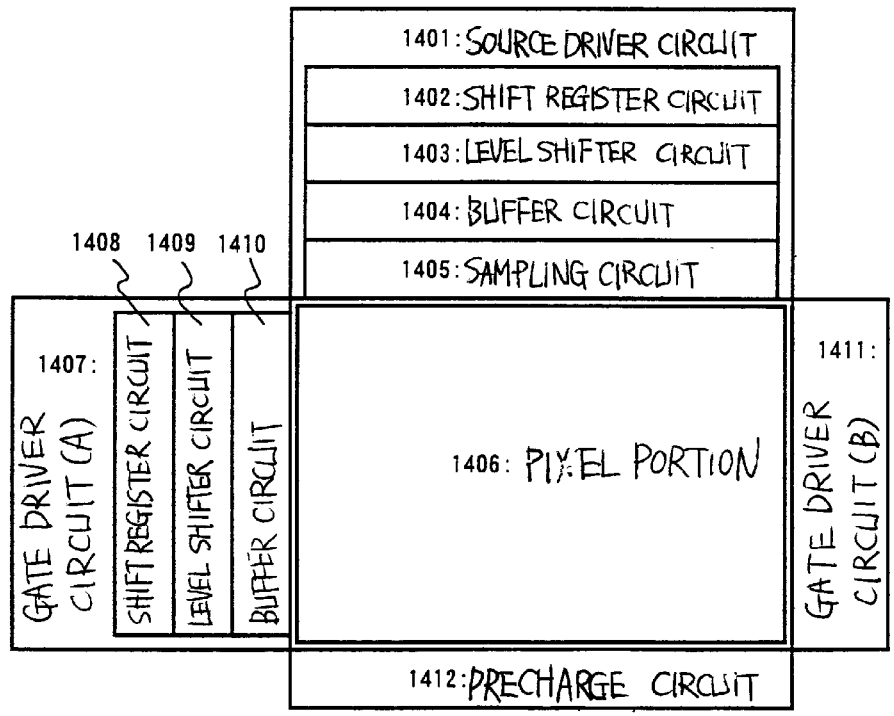
FIG. 14 is a view showing a peripheral circuit.

Next, an example of the circuit structure of the liquid crystal display device shown in FIG. 13 is shown in FIG. 14. The liquid crystal display device of this embodiment includes a source driver circuit 1401, a gate driver circuit (A) 1407, a gate driver circuit (B) 1411, a precharge circuit 1412, and a pixel portion 1406. Note that in the present specification, the driver circuit includes the source driver circuit 1401 and the gate driver circuit 1407.

The source driver circuit 1401 includes a shift register circuit 1402, a level shifter circuit 1403, a buffer circuit 1404, and a sampling circuit 1405. The gate driver circuit (A) 1407 includes a shift register circuit 1408, a level shifter circuit 1409, and a buffer circuit 1410. The gate driver circuit (B) 1411 also has the same structure.

The structure of this embodiment can be easily realized by fabricating TFTs in accordance with the steps shown in FIGS. 8A to 11B. Besides, in this embodiment, although only the structure of the pixel portion and the driver circuit is shown, when the fabricating steps of this embodiment are used, it is also possible to form a signal dividing circuit, frequency dividing circuit, D/A converter circuit, operational amplifier circuit, γ-correction circuit, and further, signal processing circuit such as a microprocessor (it may be called a logical circuit) on the same substrate.

Like this, the present invention can realize a semiconductor device including a pixel portion and a driver circuit for controlling the pixel portion on the same substrate, for example, a semiconductor device including a signal processing circuit, a driver circuit, and a pixel portion on the same substrate.

Embodiment 2

In this embodiment, a description will be made on a case where another means is used for reducing the catalytic element in the crystalline silicon film in the embodiment 1.

In the embodiment 1, although gettering for reducing a catalytic element in a crystalline silicon film is carried out by performing a heat treatment after a phosphorus element is selectively added, and gettering is carried out by performing a heat treatment in an oxidizing atmosphere including a halogen element, this embodiment shows an example in which after a gate electrode is formed, a phosphorus element is added, and a heat treatment at 500 to 650° C. for 2 to 16 hours is performed.

First, in accordance with the steps of the embodiment 1, the state of FIG. 10C was obtained. Next, phosphorus is added into an active layer with a gate electrode as a mask so that its concentration becomes $5\times10^{18}$ to $1\times10^{20}$ atoms/cm$^3$ (preferably $1\times10^{19}$ to $5\times10^{19}$ atoms/cm$^3$). However, since the concentration of phosphorus to be added is changed by temperature and time of a subsequent gettering step, and further by an area of a phosphorus doped region, the concentration is not limited to this concentration range. In this way, a region including phosphorus (hereinafter referred to as a phosphorus doped region) was formed (FIG. 15A).

Next, a heat treatment at 500 to 650° C. is carried out for 2 to 16 hours, so that gettering of a catalytic element (in this embodiment, nickel) used for crystallization of a silicon film is carried out. In order to obtain the gettering function, although a temperature of about ±50° C. from the highest temperature in a thermal history is required, since the heat treatment for crystallization is carried out at 550 to 600° C., the gettering function can be sufficiently obtained by a heat treatment at 500 to 650° C. In this embodiment, a heat treatment at 600° C. for 8 hours was performed so that nickel was moved in the direction of an arrow (shown in FIG. 15B) and was gettered and captured by phosphorus included in the phosphorus doped region. In this way a gettering region (region corresponding to the phosphorus doped region) is formed. By this, the concentration of nickel included in the phosphorus doped region is reduced to $2\times10^{17}$ atoms/cm$^3$ or less (preferably, $1\times10^{16}$ atoms/cm$^3$ or less).

Figure 15:
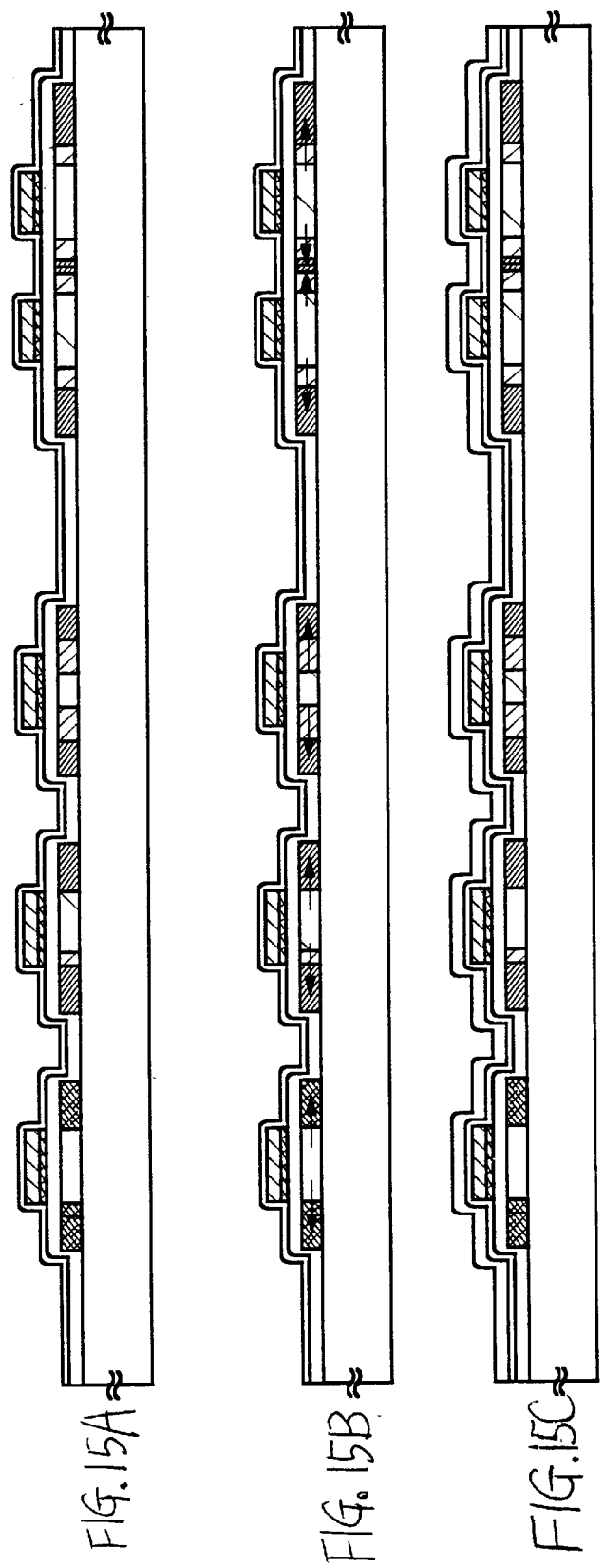
FIGS. 15A to 15C are views showing fabrication steps.

Next, similarly to the embodiment 1, a first interlayer insulating film is formed (FIG. 15C).

In accordance with the embodiment 1, the subsequent steps may be carried out so that a semiconductor device as shown in FIG. 12 is completed.

As another gettering method, a method in which gettering is performed by contact with a liquid phase using high temperature sulfuric acid may be used.

Note that the structure of this embodiment can be combined with the structure of the embodiment 1.

Embodiment 3

The crystal structure of an active layer that went through the processes up to the thermal oxidation process shown in FIG. 9A of Embodiment 1 is a unique crystal structure which has continuity in the crystal lattice. Its characteristics are described below.

The crystalline silicon film which was fabricated in accordance with the manufacturing processes of Embodiment 1 has a crystal structure in which a plurality of needle-like or column-like crystals are gathered and aligned when viewed microscopically. This may readily be confirmed through observation using TEM (transmission electron microscopy).

By using electron diffraction and X-ray diffraction, {110} plane was observed on its surface (where a channel is to be formed) as a principle orientated film though crystal axis was more or less shifted. As a result of thoroughly observing an electron diffraction photograph with a spot diameter of approximately 1.5 μm by the Applicant, it was confirmed that the diffraction spots corresponding to {110} plane appeared regularly, but that each spot is distributed on a concentric circle.

Further, the Applicant observed the crystal grain boundary formed from column-like crystals that are brought into contact with one another by HR-TEM (high resolution transmissive electron microscopy), it is confirmed that there is continuity in the crystal lattice in a crystal grain boundary. This is easily confirmed by the fact that lattice stripes observed are continuously connected in the crystal grain boundary.

The continuity of the crystal lattices in the crystal grain boundary is originated in that the crystal grain boundary is a grain boundary called 'planar grain boundary'. The definition of the term planar grain boundary in this specification agrees with the 'planar boundary' described in "Characterization of High-Efficiency Cast-Si Solar Cell Wafers by MBIC Measurement", Ryuichi Shimokawa and Yutaka Hayashi, Japanese Journal of Applied Physics, vol. 27, No. 5, pp. 751–758, 1988.

According to the above article, the planar boundary includes a twin grain boundary, a special stacking fault, a special twist grain boundary, etc. The planar boundary is characterized by being electrically inert. In other words, it may practically be regarded as nonexisting because it does not function as a trap that inhibits movement of carriers in spite of being a crystal grain boundary.

When the crystal axis (axis that is perpendicular to the crystal plane) is <110> axis, in particular, {211} twin grain boundary is also called a corresponding grain boundary of Σ3. The Σ value is a parameter serving as an indicator showing the degree of alignment in a corresponding boundary, and it is known that a grain boundary of smaller Σ value is a grain boundary showing better alignment.

As a result of observing the crystalline silicon film of the present embodiment in detail by using TEM, it is found out that the most of the crystal grain boundaries (over 90%, typically over 95%) is a corresponding grain boundary of Σ3, namely a {211} twin grain boundary.

In a crystal grain boundary formed between two crystal grains, it is known to make a corresponding grain boundary of Σ3 in case that the planar orientation of both crystals are {110}, when an angle θ, which is formed by lattice stripes corresponding to a {111} plane, is 70.5°.

In the crystalline silicon film of this embodiment, the lattice stripes are continuous at an angle of about 70.5° in adjacent crystal grains in the crystal grain boundary. Therefore it is inferred that the crystal grain boundary is a {211} twin grain boundary.

Note that a corresponding grain boundary of Σ9 is formed when θ=70.5° and these other corresponding grain boundaries also exist.

Such corresponding crystal grain boundary is only formed between crystal grains of the same planar orientation. In other words, the crystalline silicon film obtained by implementing the present embodiment can form such corresponding grain boundary in a large area because the planar orientation is almost aligned to {110}.

The crystal structure as such (the structure of the crystal grain boundary, to be strict) indicates that different two crystal grains are connected in a very well aligned manner in the crystal grain boundary. That is, the crystal lattices are continuously connected in the crystal grain boundary, so that a trap level caused by crystal defect or the like is hardly formed. Therefore a semiconductor thin film having such a crystal structure may be considered that it has practically no crystal grain boundary.

The TEM observation further verifies that most of the defects that have been present in crystal grains are eliminated by a heat treatment step at a high temperature of 700 to 1150° C. (corresponding to a thermal oxidation process or a gettering process in the present embodiment). This is also apparent from the fact that the defects are greatly decreased in number after the heat treatment step compared with the defects before the step.

This difference in the number of defects reveals as the difference in spin density in Electron Spin Resonance (ESR) analysis. Under the present circumstances, it has been found that the crystalline silicon film of this embodiment has a spin density of at no more than $5 \times 10^{17}$ spins/cm$^3$ (preferably $3 \times 10^{17}$ spins/cm$^3$ or less). However, this measured value is near the detection limit of existing measurement devices, and hence the actual spin density of the film is expectedly even lower.

[Information Regarding Electric Characteristic of a TFT]

A TFT using an active layer of the present invention showed an electric characteristic which stands to that of MOSFET. Data shown below were obtained from a TFT which the Applicant fabricated on experimental basis. (Note that the film thickness of the active layer is 30 nm, and the thickness of the gate insulating film is 100 nm.)

(1) The sub-threshold constant which may be an index of the switching performance (switching speed of ON/OFF operation) is as small as 60 to 100 mV/decade (typically 60 to 85 mV/decade) both in an n-channel TFT and a p-channel TFT.

(2) The electric field effect mobility ($\mu_{FE}$) which may be an index of TFT operation speed is as large as 200 to 650 cm$^2$/Vs (typically 300 to 500 cm$^2$/Vs) in an n-channel TFT and 100 to 300 cm$^2$/Vs (typically 150 to 200 cm$^2$/Vs) in a p-channel TFT.

(3) The threshold voltage ($V_{th}$) which may be an index of TFT driving voltage is as small as between −0.5 and 1.5 V for an n-channel TFT and between −1.5 to 0.5 V for a p-channel TFT.

As described above, it is confirmed that an extremely superior switching performance and high speed operation characteristic is attainable. Note that it is possible to freely combine the consititutions of the present embodiment with constitutions of Embodiments 1 and 2. However it is important to utilize catalyst element which promotes crystallization in crystallizing the amorphous semiconductor film as shown in Embodiment 1 or 2.

Embodiment 4

The present invention can also be applied to the case in which an interlayer insulating film is formed on a conventional MOSFET and a TFT is formed thereon. That is, it is also possible to realize a three-dimensionally structured semiconductor device. Further, it is possible to use an SOI substrate such as a SIMOX, Smart-Cut (registered trademark by SOITEC INC.), ELTRAN (registered trademark by CANON INC.), etc.

It is possible to freely combine the constitutions of the present embodiment with the constitutions of Embodiment 1 or 2.

Embodiment 5

It is possible to apply the present invention to an active matrix EL display.

Figure 16:
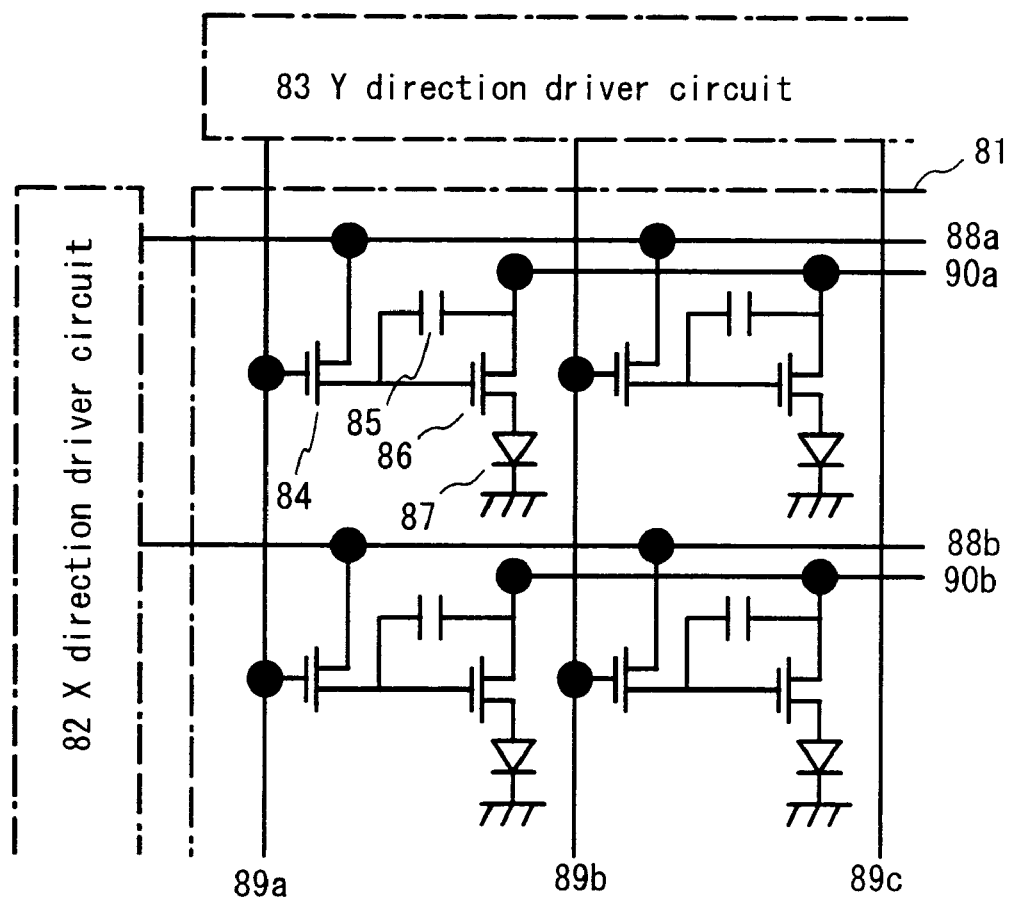
FIG. 16 is a view showing a structure of an active matrix type EL display device.

FIG. 16 is a circuit diagram of the active matrix EL display device. Reference numeral 81 denotes a display section; and X-direction driver circuit 82 and Y-direction driver circuit 83 are provided in its peripheral. Each pixel of the display section 81 comprises a switching TFT 84, a storage capacitor 85, a current control TFT 86, an organic EL element 87. X-direction signal line 88a (or 88b) and a Y-direction signal line 89a (or 89b or 89c) are connected to the switching TFT 84. Power supply lines 90a and 90b are connected to the current control TFT 86.

In the active matrix EL display device of the present embodiment, TFTs that comprise X direction driver circuit 82 and Y direction driver circuit 83 are formed by combining a p-channel TFT 1101 and an n-channel TFTs 1102 or 1103 of FIG. 11B. The switching TFT 84 and the current control TFT 86 are formed from an n-channel TFT 1104 of FIG. 11B.

Note that the constitutions of Embodiment 1 or 2 may be combined to the active matrix EL display of the present Embodiment.

Embodiment 6

It is possible to use a variety of liquid crystal materials in a liquid crystal display device manufactured in accordance with the Embodiment 1. For example, the liquid crystal materials disclosed in: Furue, H, et al., "Characteristics and Driving Scheme of Polymer-stabilized Monostable FLCD Exhibiting Fast Response Time and High Contrast Ratio with Gray-scale Capability," SID, 1998; in Yoshida, T., et al., "A Full-color Thresholdless Antiferroelectric LCD Exhibiting Wide Viewing Angle with Fast Response Time," SID 97 Digest, 841, 1997; S. Inui et al., "Thresholdless antiferroelectricity in Liquid Crystals and its Application to Displays", 671–673, J. Mater. Chem. 6(4), 1996; and in U.S. Pat. No. 5,594,569 can be used.

A liquid crystal that shows antiferroelectric phase in a certain temperature range is called an antiferroelectric liquid crystal. Among a mixed liquid crystal comprising antiferroelectric liquid crystal material, there is one called thresholdless antiferroelectric mixed liquid crystal that shows electrooptical response characteristic in which transmittivity is continuously varied against electric field. Among the thresholdless antiferroelectric liquid crystals, there are some that show V-shaped electrooptical response characteristic, and even liquid crystals whose driving voltage is approximately ±2.5 V (cell thickness approximately 1 μm to 2 μm) are found.

Figure 17:
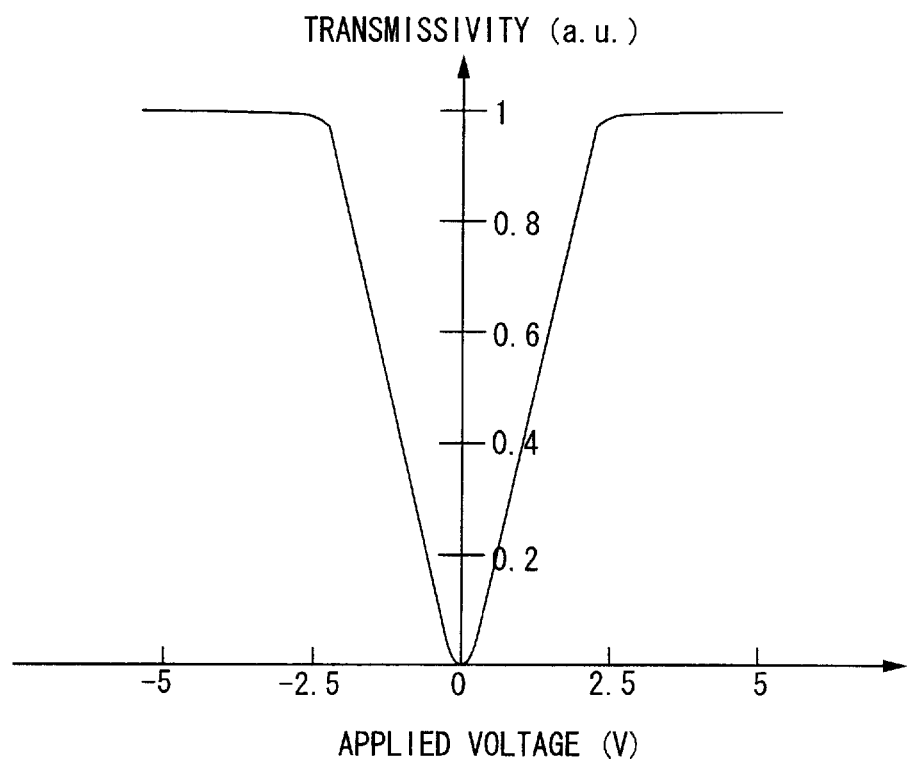
FIG. 17 is a view showing characteristics of optical transmissivity of thresholdless antiferroelectric mixed liquid crystal to applied voltage.

An example of light transmittivity characteristic against the applied voltage of thresholdless antiferroelectric mixed liquid crystal showing V-shaped electro-optical response characteristic, is shown in FIG. 17. The axis of ordinate in the graph shown in FIG. 17 is transmittivity (arbitrary unit) and the axis of the abscissas is the applied voltage. The transmitting direction of the polarizer on light incident side of the liquid crystal display is set at approximately parallel to direction of a normal line of the smectic layer of thresholdless antiferroelectric liquid crystal that approximately coincides with the rubbing direction of the liquid crystal display device. Further, the transmitting direction of the polarizer on the light radiant side is set at approximately right angles (crossed Nicols) against the transmitting direction of the polarizer on the light incident side.

As shown in FIG. 17, it is shown that low voltage driving and gray scale display is available by using such thresholdless antiferroelectric mixed liquid crystal.

It becomes possible to reduce the power supply voltage of the sampling circuit for the image signal to for example approximately 5 to 8 V in case of using such low voltage driving thresholdless antiferroelectric mixed liquid crystal to a liquid crystal display device having an analog driver. Accordingly the operation power supply voltage for the driver can be reduced and low consumption electricity and high reliability of the liquid crystal display device can be attained.

Further, also in case of using the low voltage driving thresholdless antiferroelectric mixed liquid crystal to a liquid crystal display device having a digital driver, the operation power supply voltage of the D/A converter circuit can be lowered because the output voltage of the D/A converter circuit can be lowered, and the operation power voltage of the driver can be lowered. Accordingly, low consumption electricity and high reliability of the liquid crystal display device can be attained.

Therefore the use of such low voltage driving thresholdless antiferrelectric mixed liquid crystal is effective in case of using a TFT having a relatively small LDD region (low concentration impurity region) width (for instance 0 to 500 nm, or 0 to 200 nm).

Further, thresholdless antiferroelectric mixed liquid crystal has large spontaneous polarization in general, and the dielectric constant of the liquid crystal itself is large. Therefore, comparatively large storage capacitor is required in the pixel in case of using thresholdless antiferroelectric mixed liquid crystal for a liquid crystal display device. It is therefore preferable to use thresholdless antiferroelectric mixed liquid crystal having small spontaneous polarity. It is also acceptable to compensate a small storage capacitor by lengthening a writing period of gray scale voltage to the pixel (pixel field period) by applying line sequential driving method as the driving method of the liquid crystal display device.

A low consumption electricity of a liquid crystal display is attained because low voltage driving is realized by the use of such thresholdless antiferroelectric mixed liquid crystal.

Further, any of liquid crystal display can be used as a display medium of the liquid crystal display device of the present invention on condition that the liquid crystal has an electro-optical characteristic shown in FIG. 17.

Note that it is possible to combine the constitutions of Embodiment 1 or 2 with the constitutions of the present embodiment.

Embodiment 7

CMOS circuits and pixel matrix circuits fabricated by implementing the present invention can be utilized for various electro-optical devices (active matrix liquid crystal display, active matrix EL display and active matrix EL display). Namely, the present invention can be implemented onto all of the electronic devices that incorporate such electro-optical devices as a display section.

Following can be given as such electronic devices: video cameras; digital cameras; projectors (rear type or front type); head mounted displays (goggle type displays); car navigation systems; personal computers; portable information terminals (mobile computers, portable telephones or electronic books etc.) etc. Examples of these are shown in FIGS. 18A to 20C.

FIG. 18A is a personal computer which comprises: a main body 2001; an image input section 2002; a display section 2003; and a key board 2004. The present invention can be applied to the image input section 2002, the display section 2003 and other driver circuits.

FIG. 18B is a video camera which comprises: a main body 2101; a display section 2102; a voice input section 2103; operation switches 2104; a battery 2105 and an image receiving section 2106. The present invention can be applied to the display section 2102, the voice input section 2103 and other driver circuits.

FIG. 18C is a mobile computer which comprises: a main body 2201; a camera section 2202; an image receiving section 2203; operation switches 2204 and a display section 2205. The present invention can be applied to the display section 2205 and other signal driver circuits.

FIG. 18D is a goggle type display which comprises: a main body 2301; a display section 2302; and an arm section 2303. The present invention can be applied to the display section 2302 and other driver circuits.

FIG. 18E is a player using a recording medium which records a program (hereinafter referred to as a recording medium) which comprises: a main body 2401; a display section 2402; a speaker section 2403; a recording medium 2404; and operation switches 2405. This device uses DVD (digital versatile disc), CD, etc. for the recording medium, and can perform music appreciation, film appreciation, games and the use for Internet. The present invention can be applied to the display section 2402 and other driver circuits.

FIG. 18F is a digital camera which comprises: a main body 2501; a display section 2502; a view finder 2503; operation switches 2504; and an image receiving section (not shown in the figure). The present invention can be applied to the display section 2502 and other driver circuits.

FIG. 19A is a front type projector which comprises: a projection system 2601; and a screen 2602. The present invention can be applied to the liquid crystal display device 2808 which forms, a part of the projection system 2601 and other signal control circuits.

FIG. 19B is a rear type projector which comprises: a main body 2701; a projection system 2702; a mirror 2703; and a screen 2704. The present invention can be applied to the liquid crystal display device which forms a part of the projection system 2702 and other signal control circuits.

FIG. 19C is a diagram which shows an example of the structure of a projection system 2601 and 2702 in FIGS. 19A and 19B. Projection systems 2601 and 2702 comprise: an optical light source system 2801; mirrors 2802 and 2804 to 2806; a dichroic mirror 2803; a prism 2807; a liquid crystal display device 2808; a phase differentiating plate 2809; and a projection optical system 2810. The projection optical system 2810 comprises an optical system having a projection lens. Though the present embodiment shows an example of 3-plate type, this is not to limit to this example and a single plate type may be used for instance. Further, an operator may appropriately dispose an optical lens, a film which has a function to polarize light, a film which adjusts a phase difference or an IR film, etc in the optical path shown by an arrow in FIG. 19C.

FIG. 19D is a diagram showing an example of a structure of an optical light source system 2801 in FIG. 19C. In the present embodiment the optical light source system 2801 comprises: a reflector 2811; a light source 2812; lens arrays 2813 and 2814; a polarizer conversion element 2815; and a collimator 2816. Note that the optical light source system shown in FIG. 19D is merely an example and the structure is not limited to this example. For instance, an operator may appropriately dispose an optical lens, a film which has a function to polarize light, a film which adjusts a phase difference or an IR film, etc.

Note that the projectors shown FIGS. 19A and 19C are the cases of using a transmissive type electro-optical devices, and applicable examples of a reflection type electro-optical device and an EL display device are not shown.

Figure 20A:
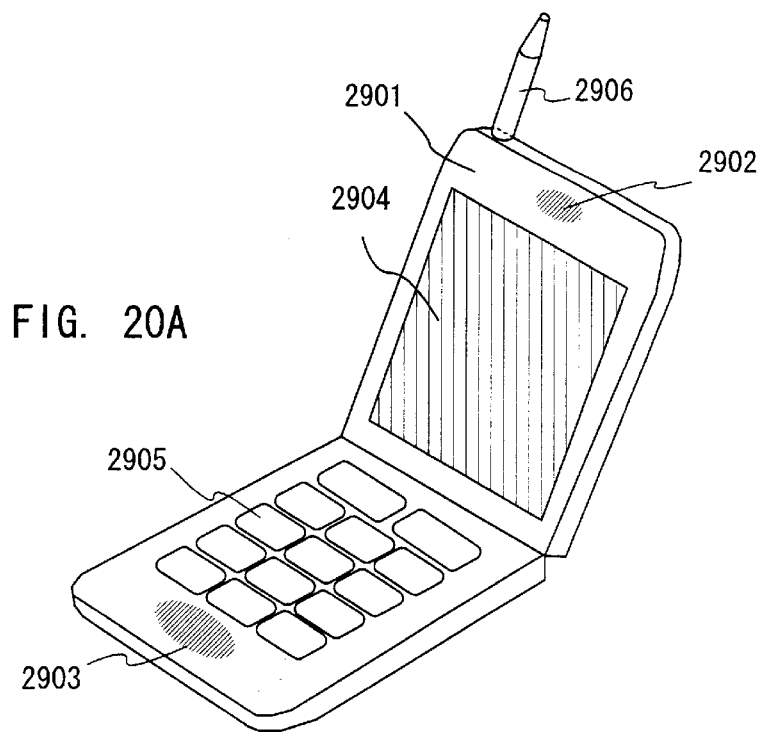
FIGS. 20A to 20C are views showing examples of electronic apparatuses.

FIG. 20A is a portable telephone which comprises: a main body 2901; a voice output section 2902; a voice input section 2903; a display section 2904; operation switches 2905; and an antenna 2906 etc. The present invention can be applied to the voice output section 2902, the voice input section 2903, the display section 2904 and other driver circuits.

Figure 20B:
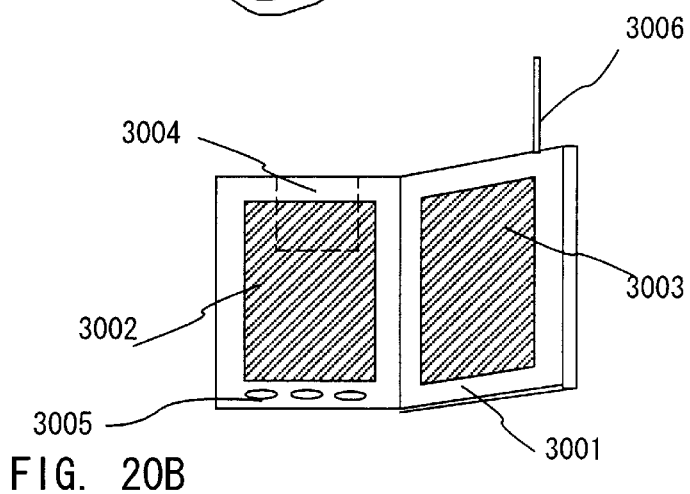

FIG. 20B is a portable book (electronic book) which comprises: a main body 3001; display sections 3002 and 3003; a recording medium 3004; operation switches 3005 and an antenna 3006 etc. The present invention can be applied to the display sections 3002 and 3003, and other driver circuits.

Figure 20C:
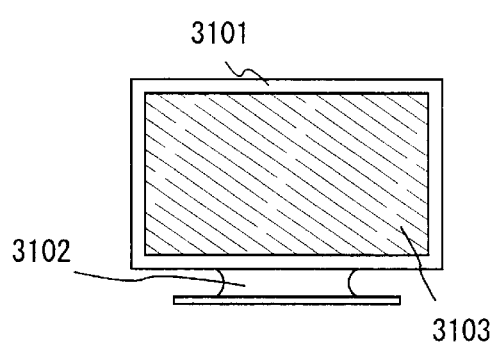

FIG. 20C is a display which comprises: a main body 3101; a supporting section 3102; and a display section 3103 etc. The present invention can be applied to the display section 3103. The display of the present invention is advantageous specifically when large sized, and it is advantageous in a display having a diagonal exceeding 10 inches (specifically 30 inches).

As described above, the applicable range of the present invention is very large, and the invention can be applied to electronic devices of various areas. Note that the electronic devices of the present embodiment can be achieved by utilizing any combination of constitutions in Embodiments 1 to 6.

Embodiment 8

An example of manufacturing an EL (electro-luminescence) display device by using the present invention is described in the present Embodiment. Note that FIG. 23A is a top view of an EL display device of the present invention and FIG. 23B shows its cross sectional structure.

Figure 23A:
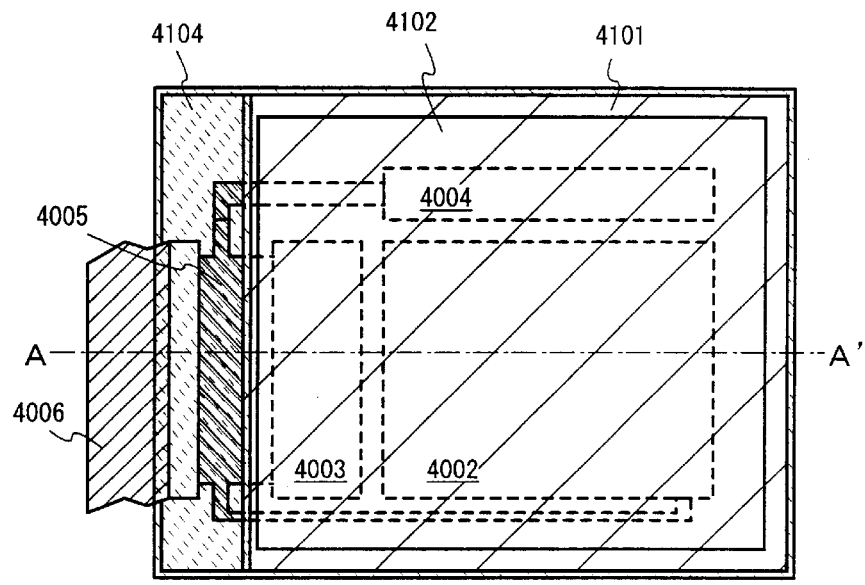
FIGS. 23A and 23B are a top view and a sectional view of an EL display device.

In FIG. 23A: reference numeral 4001 denotes a substrate; 4002, a pixel section; 4003, a source driver circuit; 4004, a gate driver circuit. Each driver circuit reaches FPC (flexible print circuit) 4006 through wiring 4005, and then connected to external machines.

Here, a first sealing material 4101, a cover material 4102, a filling material 4103 and second sealing material 4104 are disposed to surround a pixel section 4002, a source driver circuit 4003 and a gate driver circuit 4004.

Figure 23B:
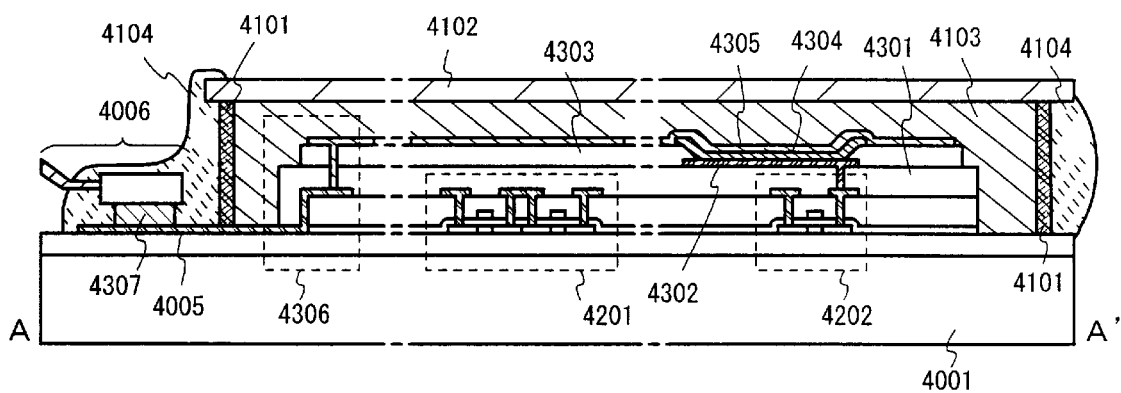

Further, FIG. 23B corresponds to a cross-sectional diagram at A–A' of FIG. 23A. A driver TFT 4201 which comprises a source driver circuit 4003 (note that an n-channel TFT and a p-channel TFT are shown in the figure) and a current control TFT (a TFT which controls electric current that flows into an EL element) 4202 which comprises the pixel section 4002 are formed over a substrate 4001.

In the present embodiment a TFT having the same structure as a p-channel TFT or an n-channel TFT in FIG. 12 is used for a driver TFT 4201 and a TFT having the same structure as a p-channel TFT in FIG. 12 is used for a current control TFT 4202. Further, a storage capacitor (not shown) which is connected to the gate of a current control TFT 4202 is disposed in the pixel section 4002.

An interlayer insulating film (flattening film) 4301 comprising a resin material is formed over a driver TFT 4201 and a pixel TFT 4202, and a pixel electrode (anode) 4302 that is electrically connected to the drain of a pixel TFT 4202 is formed thereon. As a pixel electrode 4302, a transparent conductive film which has a large work function is used. A compound of indium oxide and tin oxide, a compound of indium oxide and zinc oxide zinc oxide, tin oxide or indium oxide can be used as the transparent conductive film. In addition, a material added with gallium to the above stated transparent conductive film may also be used.

An insulating film 4303 is formed on the pixel electrode 4302 and an opening section is formed in the insulating film 4303 at above the pixel electrode 4302. In this opening section an EL (electro-luminescence) layer 4304 is formed over the pixel electrode 4302. A known organic or inorganic EL material can be used for the EL layer 4304. Further though there are small molecular materials and polymer materials in the organic EL materials, either may be used.

A known evaporation technique or a coating technique may be used for the formation method of the EL layer 4304. Further, the structure of EL layer may be a laminate structure or a single layer structure by freely combining a hole injection layer, a hole transport layer, a light emitting layer, an electron transport layer or an electron injection layer.

A cathode 4305 comprising a conductive film containing an element which belongs to group 1 or 2 of the periodic table (typically a conductive film in which alkali metal element or alkali earth metal element is included in aluminum, copper or silver) is formed over EL layer 4304. It is preferable to avoid as much as possible of moisture and oxygen that exist in the interface between the cathode 4305 and the EL layer 4304. Accordingly measures such as successive deposition of the two in a vacuum, or forming EL layer 4304 in a nitrogen or noble gas atmosphere and then forming cathode 4305 without contact to oxygen and moisture, are required. In the present embodiment the deposition described above is made possible by using a deposition apparatus such as a multi-chamber system (cluster-tool system).

The cathode 4305 is electrically connected to the wiring 4005 in a region denoted by reference numeral 4306. Wiring 4005 is a wiring for applying preset voltage to the cathode 4305 and is electrically connected to FPC 4006 through an isotropic conductive film 4307.

Thus an EL element which comprises a pixel electrode (anode) 4302, an EL layer 4304 and a cathode 4305 is formed. The EL elements are surrounded by first sealing material 4101 and a cover member 4102 which is stuck to a substrate 4001 by the first sealing material 4101 and sealed by filling material 4103.

As the cover member 4102, a glass material, a metallic material (typically stainless steel), a ceramics material and a plastic material (including a plastic film) can be used. As a plastic material, FRP (fiberglass-reinforced plastics) plate, PVF (polyvinyl fluoride) film, Myler film, polyester film or acrylic resin film can be used. Further, a sheet having a structure in which aluminum foil is sandwiched by PVF film or Myler film can be used.

Note however, the cover member needs to be transparent in case that radiation from EL elements are directed to the direction toward cover member. In such cases, a transparent substance such as a glass plate, a plastic plate, a polyester film or an acrylic film is used.

A ultraviolet ray curing resin or a thermosetting resin can be used as filling material 4103, and PVC (polyvinyl chloride), acrylic, polyimide, epoxy resin, silicone resin, PVB (polyvinyl butyral), or EVA (ethylene vinyl acetate) can be used. If a drying agent (preferably barium oxide) is formed on the inside of the filling material 4103, deterioration of EL elements can be prevented.

Further, spacers may be included within the filling material 4103. When the spacers are formed from barium oxide, it is possible to give the ability to absorb moisture to the spacers themselves. In addition, it is effective to provide a resin film over cathode 4305, as a buffer layer that releases pressure from the spacers in case of disposing the spacers.

The wiring 4005 is electrically connected to the FPC 4006 through anisotropic conductive film 4307. Wiring 4005 transmits signals that are sent to pixel section 4002, source driver circuit 4003 and gate driver circuit 4004 to FPC 4006, and is electrically connected to aniexternal device by FPC 4006.

In the present embodiment a structure that thoroughly shields the EL elements from external atmosphere is employed in which second sealing material 4104 is provided so as to cover the exposed portions of first sealing material 4101 and a part of FPC 4006. An EL display device having the cross sectional structure of FIG. 23B is thus complete.

Figure 24:
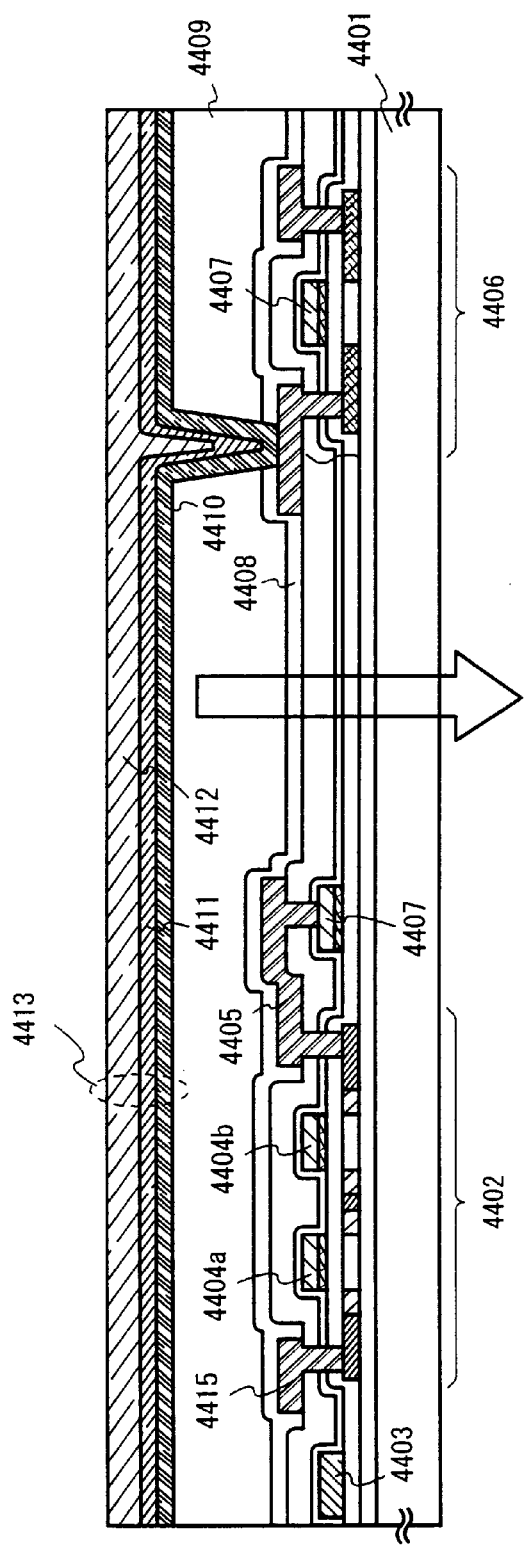
FIG. 24 is a sectional view of an EL display device.
Figure 25A:
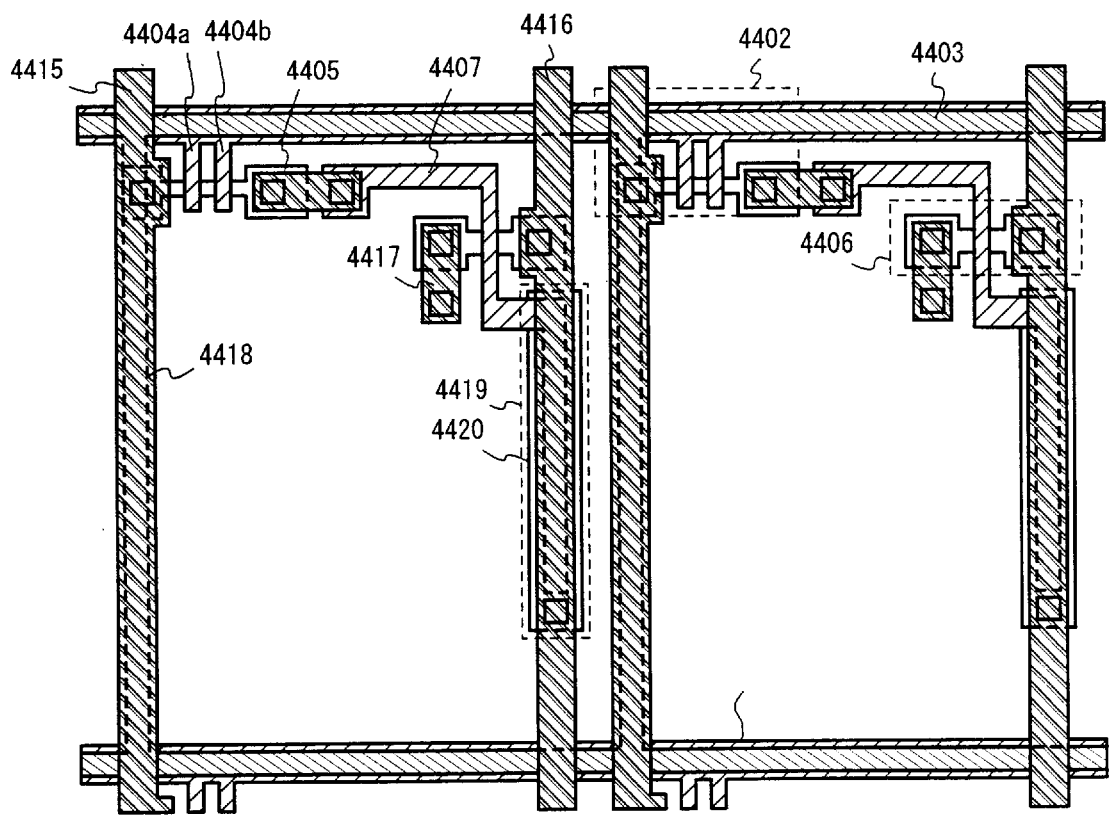
FIGS. 25A and 25B are a top view and a circuit view of an EL display device.
Figure 25B:
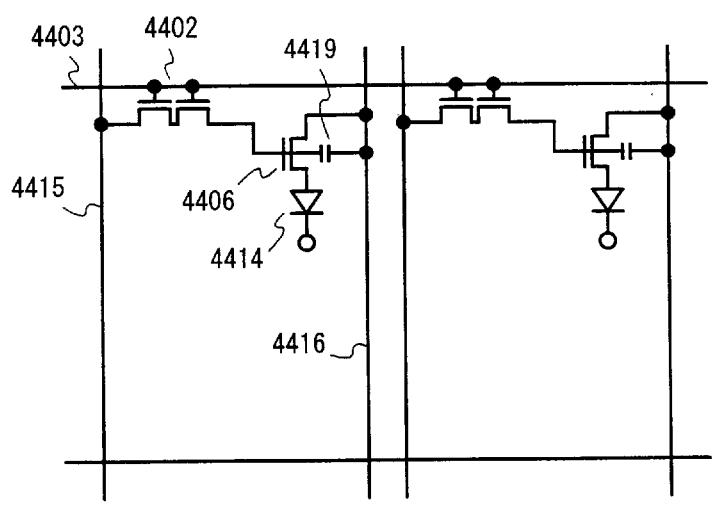

A more detailed structure on a cross section of pixel section is shown in FIG. 24, a top view is shown in. FIG. 25A, and circuit diagram is shown in FIG. 25B. Common reference numerals are used in FIGS. 24, 25A and 25B, so that the figures may be compared with each other.

In FIG. 24, switching TFT 4402 disposed over substrate 4401 is formed from an n-channel TFT 1104 of FIG. 12. Accordingly, the description of n-channel TFT 1104 of FIG. 12 may be referred regarding the structure. The wiring shown by 4403 is a gate wiring that electrically connects gate electrodes 4404*a* and 4404*b* of switching TFT 4402.

Note that while the present invention uses a double gate structure in which 2 channel forming regions are formed, single gate structure in which one channel forming region is formed or a triple gate structure in which 3 channel forming regions are formed are also acceptable.

The drain wiring 4405 of switching TFT 4402 is electrically connected to gate electrode 4407 of current control TFT 4406. Note that current control TFT 4406 is formed from a p-channel TFT 1101 of FIG. 12. Accordingly, the description of the p-channel TFT 1101 of FIG. 12 may be referred regarding the description of the structure. Note that while the present embodiment uses a single gate structure, a double gate structure or a triple gate structure are also acceptable.

A first passivation film 4408 is disposed over the switching TFT 4402 and the current control TFT 4406, and a planarization film 4409 comprising resin is formed on top. It is very important to flatten by using the planarization film 4409, the step due to the TFTs. Since an EL layer formed later is extremely thin, there are cases in which defective luminescence is caused due to the existence of the step. Therefore, it is preferable to planarize before forming pixel electrode so as to form an EL layer on a planarized surface as possible.

The reference numeral 4410 denotes a pixel electrode (anode of EL element) comprising a transparent conductive film, and is electrically connected to the drain wiring 4417 of current control TFT 4406. A compound of indium oxide and tin oxide, a compound of indium oxide and zinc oxide, zinc oxide, tin oxide or indium oxide can be used as the transparent conductive film. Further, said conductive transparent including gallium may also be used.

An EL layer 4411 is formed on pixel electrode 4410. Note that while FIG. 24 shows only 1 pixel, EL layers corresponding to each colors of R (red), G (green) and B (blue) are each formed properly in the present embodiment. A small molecular type organic EL material is formed by evaporation in the present embodiment. In concrete, a laminate structure is formed from a copper phthalocyanine (CuPc) film of 20 nm thickness disposed as a hole injection layer, and tris-8-quinolinolate aluminum complex (Alq$_3$) film formed thereon into 70 nm thickness as a luminescent layer. A luminescent color may be controlled by adding fluorescent dye such as quinacridon, Perylene or DCM1 into Alq$_3$.

However, the above example is one example of the organic EL materials that can be used as luminescence layers, and it is not necessary to limit to these materials. An EL layer (a layer for luminescence and for performing carrier motion for luminescence) may be formed by freely combining luminescence layer, charge transport layer, or charge injection layer. For example, an example using small molecular type materials as luminescence layers is shown in the present embodiment, but polymer type organic EL materials may also be used. Further, it is possible to use inorganic materials such as silicon carbide, etc., as charge transport layer and charge injection layer. Publicly known materials can be used for these organic EL materials and inorganic materials.

A cathode 4412 comprising a conductive film is next formed on EL layer 4411. In the case of the present embodiment, an alloy film of aluminum and lithium is used as the conductive film. Needless to say, a publicly known MgAg film (alloy film of magnesium and silver) may also be used. As the cathode material, a conductive film comprising an element belonging to periodic table group 1 or 2, or a conductive film added with at least one of these elements, may be used.

EL element 4413 is completed at the point when this cathode 4412 is formed. Note that an EL element 4413 formed here represents a capacitor formed from pixel electrode (anode) 4410, EL layer 4411 and cathode 4412.

The top view of the pixel in the present embodiment is next described by using FIG. 25A. Source region of switching TFT 4402 is connected to source wiring 4415 and drain region is connected to drain wiring 4405. Further, drain wiring 4405 is electrically connected to gate electrode 4407 of current control TFT 4406. Source region of current control TFT 4406 is electrically connected to current supply line 4416 and drain region is electrically connected to drain wiring 4417. Drain wiring 4417 is electrically connected to pixel electrode (anode) 4418 shown by dotted line.

Here, a storage capacitor is formed in the region shown by 4419. Storage capacitor 4419 is formed from a semiconductor film 4420 electrically connected to current supply line 4416, an insulating film formed of the same layer as gate insulating film (not shown) and gate electrode 4407. Further, it is possible to use a capacitance formed from gate electrode 4407, a layer formed from the same layer as the first interlayer insulating film (not shown) and current supply line 4416, for a storage capacitor.

Embodiment 9

Figure 26:
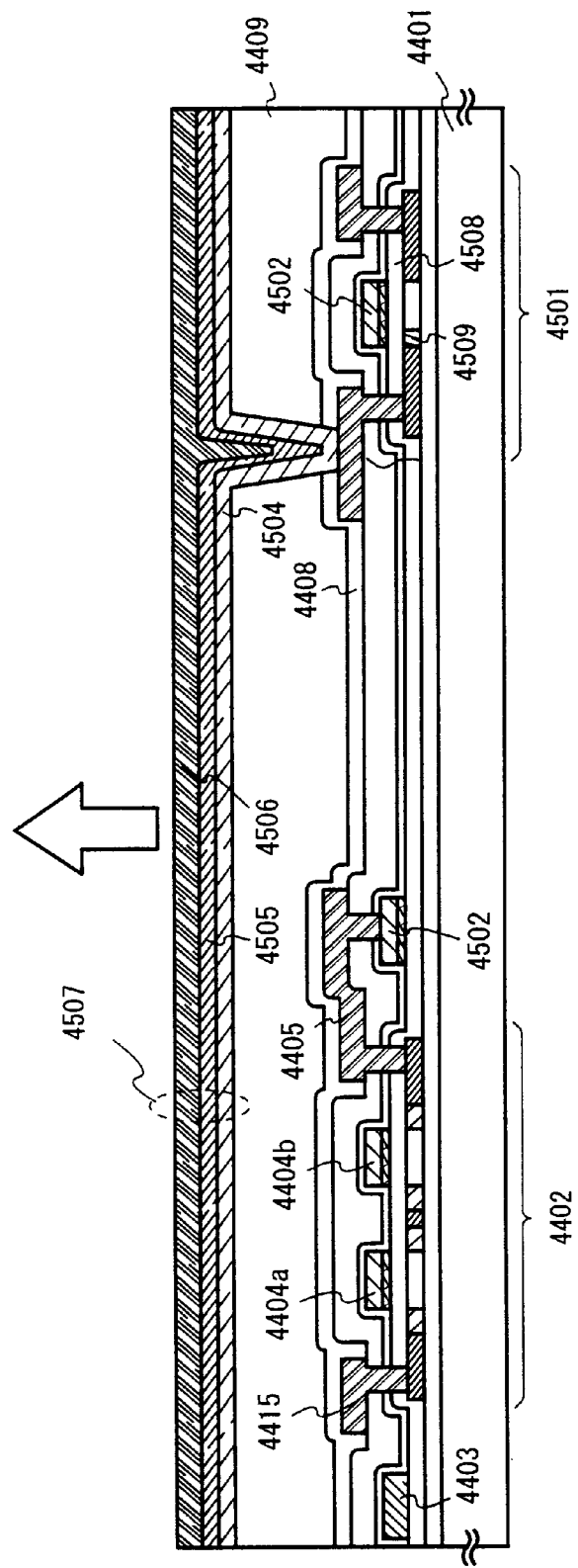
FIG. 26 is a sectional view of an EL display device.

In embodiment 9 an EL display device having a pixel structure differing from embodiment 8 is described. FIG. 26 is used for explanation. Note that the description of embodiment 8 may be referred regarding parts where the same reference numerals as FIG. 25 are given.

In FIG. 26 a TFT having the same structure as n-channel TFT 1102 of FIG. 12 is used as current control TFT 4501. Needless to say, gate electrode 4502 of current control TFT 4501 is electrically connected to drain wiring 4405 of switching TFT 4402. Drain wiring 4503 of current control TFT 4501 is electrically connected to pixel electrode 4504.

In embodiment 9, a pixel electrode 4504 comprising a conductive film functions as a cathode of the EL element. An alloy film of aluminum and lithium is used in concrete, but a conductive film comprising an element belonging to periodic table group 1 or 2, or a conductive film added with such element may be used here.

EL layer 4505 is formed on top of pixel electrode 4504. Note that though FIG. 26 shows only 1 pixel, EL layer corresponding to G (green) is formed in the present embodiment by evaporation method or coating method (preferably spin coating). In concrete, it is a laminate structure comprising a lithium fluoride (LiF) film of 20 nm thickness provided as electron injection layer and a PPV (poly-p-phenylene vinylene) of 70 nm thickness provided thereon as luminescence layer.

An anode 4506 comprising transparent conductive film is next disposed on EL layer 4505. In the present embodiment, a compound of indium oxide and tin oxide or a compound of indium oxide and zinc oxide is used as the transparent conductive film.

On completing formation of anode 4506, an EL element 4507 is finished. Note that EL element 4507 represents here a capacitor formed from pixel electrode (cathode) 4504, EL layer 4505 and anode 4506.

Degradation due to hot carrier effect is actualized in a current control TFT 4501 in case that the voltage applied to the EL element is such a high voltage as exceeding 10 V. It is effective to use an n-channel TFT having a structure of the present invention as the current control TFT 4501.

Note that, the current control TFT 4501 of the present embodiment forms a parasitic capacitance, which is referred to as gate capacitance, in between gate electrode 4502 and LDD regions 4509. It is possible to provide the same function as storage capacitor 4419 shown in FIGS. 25A and 25B by adjusting this gate capacitance. Specifically in case of driving the EL display device by digital driving method, it is possible to use the gate capacitance for storage capacitor because the capacitance of storage capacitor can be smaller compared to the case of driving by analog driving method.

Note that an n-channel TFT having a structure in which LDD region 4509 is omitted from the structure shown in FIG. 26 may be used in case the voltage applied to an EL element is less than 10 V preferably less than 5 V because above stated degradation due to hot carrier effect would not become a serious problem.

Embodiment 10

Figure 27A:
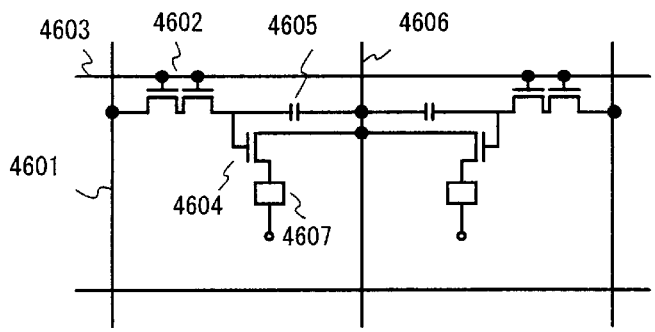
FIGS. 27A to 27C are equivalent circuit views of EL display devices.
Figure 27B:
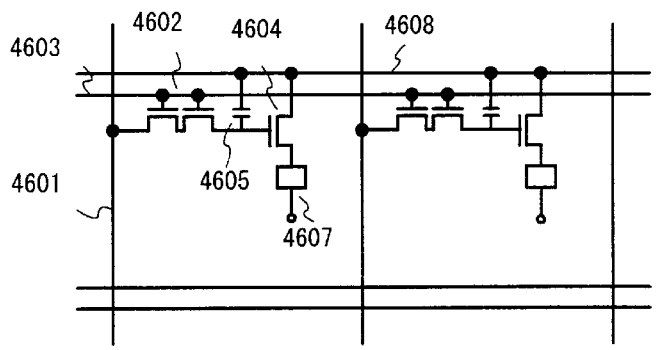
Figure 27C:
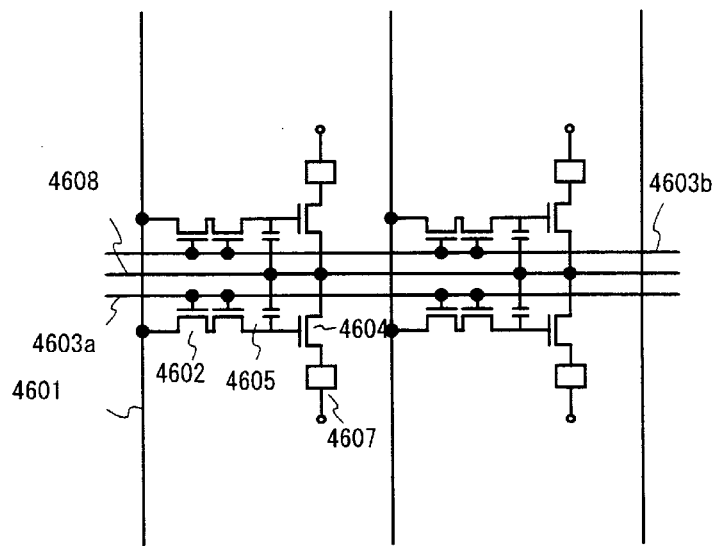

In this embodiment, examples of a pixel structure which can be used for a pixel portion of an EL display device shown in the embodiment 8 or 9 will be shown in FIGS. 27A to 27C. Note that in this embodiment, reference numeral 4601 designates a source wiring line of a switching TFT 4602; 4603, a gate wiring line of the switching TFT 4602; 4604, a current controlling TFT; 4605, a capacitor; 4606 and 4608, current supply lines; and 4607, an EL component.

FIG. 27A shows an example of a case in which the current supply line 4606 is made common to two pixels. That is, this example is characterized in that two pixels are formed to become linearly symmetrical with respect to the current supply line 4606. In this case, since the number of current supply lines can be reduced, the pixel portion can be made further minute.

FIG. 27B shows an example of a case in which the current supply line 4608 is provided in parallel with the gate wiring line 4603. In FIG. 27B, although such a structure is adopted that the current supply line 4608 and the gate wiring line 4603 do not overlap with each other, if both are wiring lines formed in different layers, it is also possible to provide the lines so that both are overlapped with each other through an insulating film. In this case, since an occupied area can be made common to the current supply line 4608 and the gate wiring line 4603, the pixel portion can be made further minute.

FIG. 27C shows an example characterized in that similarly to the structure of FIG. 27B, the current supply line 4608 is provided to be in parallel with gate wiring lines 4603a and 4603b, and further, two pixels are formed to become linearly symmetrical with respect to the current supply line 4608. It is also effective to provide the current supply line 4608 so that it overlaps with either one of the gate wiring lines 4603a and 4603b. In this case, since the number of current supply lines can be decreased, the pixel portion can be made further minute.

Embodiment 11

Figure 28A:
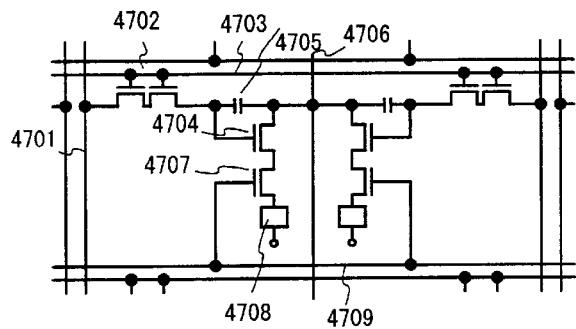
FIGS. 28A and 28B, are equivalent circuit views of EL display devices.
Figure 28B:
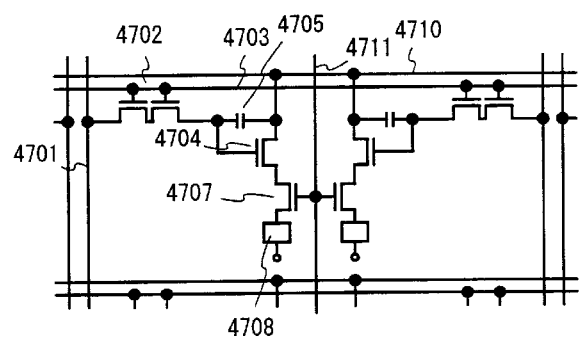

In this embodiment, examples of a pixel structure of an EL display device in which the invention is carried out will be shown in FIGS. 28A and 28B. In this embodiment, reference numeral 4701 designates a source wiring line of a switching TFT 4702; 4703, a gate wiring line of the switching TFT 4702; 4704, a current controlling TFT; 4705, a capacitor (can be omitted); 4706, a current supply line; 4707, a power source controlling TFT; 4708, an EL component; and 4709, a power source controlling gate wiring line. The operation of the power source controlling TFT 4707 may be referred to Japanese Patent Application No. Hei. 11-341272 (not published).

In this embodiment, although the power source controlling TFT 4707 is provided between the current controlling TFT 4704 and the EL component 4708, such a structure may be adopted that the current controlling TFT 4704 is provided between the power source controlling TFT 4707 and the EL component 4708. It is preferable that the power source controlling TFT 4707 is made to have the same structure as the current controlling TFT 4704 or is formed of the same active layer as the current controlling TFT and is connected in series therewith.

FIG. 28A shows an example of a case in which the current supply line 4706 is made common to two pixels. That is, this example is characterized in that two pixels are formed to become linearly symmetrical with respect to the current supply line 4706. In this case, since the number of current supply lines can be reduced, the pixel portion can be made further minute.

FIG. 28B shows an example of a case in which a current supply line 4710 is provided in parallel with the gate wiring line 4703, and a power source controlling gate wiring line 4711 is provided in parallel with the source wiring line 4701. Note that in FIG. 28B, although such a structure is adopted that the current supply line 4710 and the gate wiring line 4703 do not overlap with each other, if both are wiring lines formed in different layers, it is also possible to provide the lines so that both are overlapped with each other through an insulating film. In this case, since an occupied area can be made common to the current supply line 4710 and the gate wiring line 4703, the pixel portion can be made further minute.

Embodiment 12

Figure 29A:
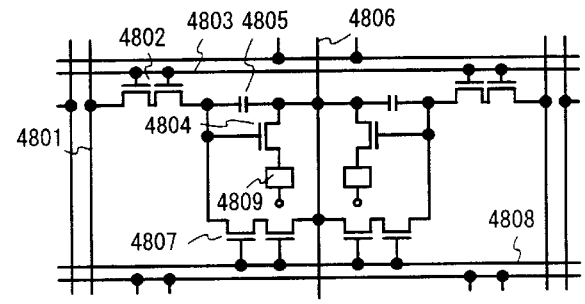
FIGS. 29A and 29B are equivalent circuit views of EL display devices.
Figure 29B:
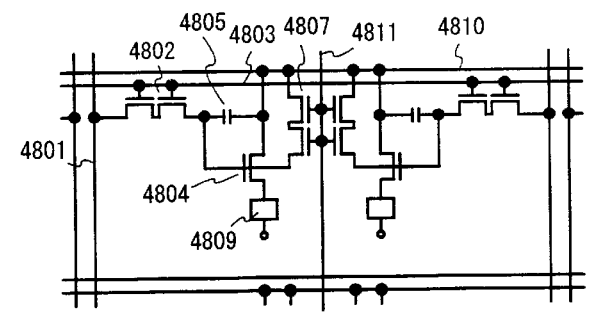

In this embodiment, examples of a pixel structure of an EL display device in which the invention is carried out will be shown in FIGS. 29A and 29B. In this embodiment, reference numeral 4801 designates a source wiring line of a switching TFT 4802; 4803, a gate wiring line of the switching TFT 4802; 4804, a current controlling TFT; 4805, a capacitor (can be omitted); 4806, a current supply line; 4807, an erasing TFT; 4808, an erasing gate wiring line; and 4809, an EL component. The operation of the erasing TFT 4807 may be referred to Japanese Patent Application No. Hei. 11-338786 (not published).

The drain of the erasing TFT 4807 is connected to the gate of the current controlling TFT 4804, so that a gate voltage of the current controlling TFT 4804 can be forcibly changed. Although the erasing TFT 4807 may be made of an n-channel TFT or a p-channel TFT, it is preferable that the TFT has the same structure as the switching TFT 4802 so that an off current can be made small.

FIG. 29A shows an example of a case in which the current supply line 4806 is made common to two pixels. That is, this example is characterized in that two pixels are formed to become linearly symmetrical with respect to the current supply line 4806. In this case, since the number of current supply lines can be reduced, the pixel portion can be made further minute.

FIG. 29B shows an example of a case in which a current supply line 4810 is provided in parallel with the gate wiring line 4803, and an erasing gate wiring line 4811 is provided in parallel with the source wiring line 4801. In FIG. 29B, although such a structure is adopted that the current supply line 4810 and the gate wiring line 4803 do not overlap with each other, if both are wiring lines formed in different layers, it is also possible to provide the lines so that both are overlapped with each other through an insulating film. In this case, since an occupied area can be made common to the current supply line 4810 and the gate wiring line 4803, the pixel portion can be made further minute.

Embodiment 13

In the structure of an EL display device in which the invention is carried out, the number of TFTs provided in a pixel is not limited. For example, four to six or more TFTs may be provided. The invention can be carried out without limiting the pixel structure of the EL display device.

As described above, according to the technique of the invention, a heat treatment time required for a crystallization step is shortened and a TFT having excellent electrical characteristics can be fabricated.

Besides, a heat treatment time required for gettering is shortened, and a TFT having excellent electrical characteristics can be fabricated.

Besides, by optimizing the width and arrangement of catalytic element introduction regions with the technique of the invention, it is possible to effectively arrange the catalytic element introduction regions in a small space and to make a circuit minute and integrated.

What is claimed is:

1. A semiconductor device comprising a TFT, said TFT comprising: an active layer comprising a crystalline semiconductor film over a substrate having an insulating surface, said active layer comprising at least a channel forming region, a source region, and a drain region,
    wherein said active layer comprises a plurality of crystals each extending in a source-drain direction and a boundary portion of said plurality of crystals, said boundary portion located in one of the source region and the drain region and extending in a channel width direction, and
    wherein said active layer is free from regions where elements for promoting crystallization are added.

2. A device according to claim 1, wherein said active layer further comprises at least one LDD region located between the channel forming region and the source and drain regions.

3. A device according to claim 1, wherein the boundary portion has a linear shape.

4. A device comprising a display medium made of a semiconductor device according to claim 1.

5. A device according to claim 4, wherein the semiconductor device is one selected from the group consisting of a video camera, a digital camera, a projector, a goggle type display, a car navigation system, a personal computer, and a portable information terminal.

6. A device according to claim 1, wherein said semiconductor device comprises an EL display device.

7. A semiconductor device comprising a TFT, said TFT comprising:
    an active layer comprising a crystalline semiconductor film over a substrate having an insulating surface, said active layer comprising a plurality of channel forming regions, source and drain regions, and at least one impurity region located between said channel forming regions,
    wherein said active layer comprises a plurality of crystals each extending in a source-drain direction and a boundary portion of said plurality of crystals, said boundary portion located in said impurity region and extending in a channel width direction, and
    wherein said active layer is free from regions where elements for promoting crystallization are added.

8. A device according to claim 7, wherein said active layer further comprises at least one LDD region located between the impurity region and the channel forming regions.

9. A device according to claim 7, wherein the boundary portion has a linear shape.

10. A device comprising a display medium made of a semiconductor device according to claim 7.

11. A device according to claim 10, wherein the semiconductor device is one selected from the group consisting of a video camera, a digital camera, a projector, a goggle type display, a car navigation system, a personal computer, and a portable information terminal.

12. A device according to claim 7, wherein said semiconductor device comprises an EL display device.

13. A semiconductor device having a CMOS circuit comprising an n-channel TFT and a p-channel TFT, each of said TFTs comprising:
    an active layer comprising a crystalline semiconductor film over a substrate having an insulating surface over a substrate having an insulating surface, said active layer comprising at least a channel forming region, a source region, and a drain region, wherein said active layer comprises a plurality of crystals each extending in a source-drain direction and said active layer is free from regions where elements for promoting crystallization are added, and wherein one of the source region and the drain region of said n-channel TFT includes a boundary portion of the plurality of crystals, said boundary portion extending in a channel width direction of said active layer.

14. A device according to claim 13, wherein said active layer of the n-channel TFT further comprises at least one LDD region located between the channel forming region and the source and drain regions.

15. A device according to claim 13, wherein the boundary portion has a linear shape.

16. A device comprising a display medium made of a semiconductor device according to claim 13.

17. A device according to claim 16, wherein the semiconductor device is one selected from the group consisting of a video camera, a digital camera, a projector, a goggle type display, a car navigation system, a personal computer, and a portable information terminal.

18. A device according to claim 13, wherein said semiconductor device comprises an EL display device.

19. A semiconductor device having a CMOS circuit comprising an n-channel TFT and a p-channel TFT, each of said TFTs comprising:

an active layer comprising a crystalline semiconductor film over a substrate having an insulating surface over a substrate having an insulating surface, said active layer comprising at least a channel forming region, a source region, and a drain region, wherein said active layer comprises a plurality of crystals each extending in a source-drain direction and said active layer is free from regions where elements for promoting crystallization are added, and wherein one of the source region and the drain region of said p-channel TFT includes a boundary portion of the plurality of crystals, said boundary portion extending in a channel width direction of said active layer.

20. A device according to claim 19, wherein said active layer of the n-channel TFT further comprises at least one LDD region located between the channel forming region and the source and drain regions.

21. A device according to claim 19, wherein the boundary portion has a linear shape.

22. A device comprising a display medium made of a semiconductor device according to claim 19.

23. A device according to claim 22, wherein the semiconductor device is one selected from the group consisting of a video camera, a digital camera, a projector, a goggle type display, a car navigation system, a personal computer, and a portable information terminal.

24. A device according to claim 19, wherein said semiconductor device comprises an EL display device.

25. A device according to claim 1, wherein said elements for promoting crystallization are one kind or plural kinds of elements selected from the group consisting of Ni, Fe, Co, Cu, Ge, and Pd.

26. A device according to claim 7, wherein said elements for promoting crystallization are one kind or plural kinds of elements selected from the group consisting of Ni, Fe, Co, Cu, Ge, and Pd.

27. A device according to claim 13, wherein said elements for promoting crystallization are one kind or plural kinds of elements selected from the group consisting of Ni, Fe, Co, Cu, Ge, and Pd.

28. A device according to claim 19, wherein said elements for promoting crystallization are one kind or plural kinds of elements selected from the group consisting of Ni, Fe, Co, Cu, Ge, and Pd.

29. A semiconductor device comprising a TFT, said TFT comprising: an active layer comprising a crystalline semiconductor film over a substrate having an insulating surface, said active layer comprising at least a channel forming region, a source region, and a drain region, wherein said active layer comprises a plurality of crystals each extending in a source-drain direction and a boundary portion of said plurality of crystals, said boundary portion located in one of the source region and the drain region and extending in a channel width direction, and wherein said active layer is free from regions where elements for promoting crystallization are added and where gettering elements are added.

30. A device according to claim 29, wherein said active layer further comprises at least one LDD region located between the channel forming region and the source and drain regions.

31. A device according to claim 29, wherein said elements for promoting crystallization are one kind or plural kinds of elements selected from the group consisting of Ni, Fe, Co, Cu, Ge, and Pd.

32. A device according to claim 29, wherein said gettering elements is phosphorus.

33. A device according to claim 29, wherein the boundary portion has a linear shape.

34. A device according to claim 29, wherein the semiconductor device is one selected from the group consisting of a video camera, a digital camera, a projector, a goggle type display, a car navigation system, a personal computer, and a portable information terminal.

35. A device according to claim 29, wherein said semiconductor device comprises an EL display device.

* * * * *